(12) United States Patent
Chatterjee et al.

(10) Patent No.: US 8,860,147 B2
(45) Date of Patent: Oct. 14, 2014

(54) SEMICONDUCTOR INTERCONNECT

(75) Inventors: Amitava Chatterjee, Plano, TX (US); Howard Tigelaar, Allen, TX (US); Victor Sutcliffe, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 280 days.

(21) Appl. No.: 11/944,861

(22) Filed: Nov. 26, 2007

(65) Prior Publication Data
US 2009/0134471 A1    May 28, 2009

(51) Int. Cl.
  *H01L 23/532*   (2006.01)
  *H01L 21/768*   (2006.01)
  *H01L 23/522*   (2006.01)
  *H01L 27/118*   (2006.01)

(52) U.S. Cl.
  CPC .... *H01L 21/76816* (2013.01); *H01L 23/53238* (2013.01); *H01L 21/76895* (2013.01); *H01L 21/76877* (2013.01); *H01L 27/11807* (2013.01); *H01L 23/53257* (2013.01); *H01L 23/5226* (2013.01)
  USPC ............ 257/383; 257/E23.155; 257/E21.495; 438/656

(58) Field of Classification Search
  USPC ........... 257/383, E29.116–E29.122, E29.284, 257/E29.299, 664–665, 734–786, 257/E21.575–E21.597, E21.627, E21.641; 438/292–308, 629, 638, 619
  See application file for complete search history.

(56) References Cited

U.S. PATENT DOCUMENTS

| | | | | |
|---|---|---|---|---|
| 4,837,609 A * | 6/1989 | Gurvitch et al. | ................ | 257/43 |
| 5,763,923 A * | 6/1998 | Hu et al. | ........................ | 257/382 |
| 5,897,369 A * | 4/1999 | Jun | ................ | 438/629 |
| 6,235,629 B1 * | 5/2001 | Takenaka | ...................... | 438/638 |
| 6,352,920 B1 * | 3/2002 | Shimomura | .................. | 438/637 |
| 6,545,358 B2 | 4/2003 | Jeong | | |
| 6,576,550 B1 * | 6/2003 | Brase et al. | .................. | 438/638 |
| 2005/0127516 A1 * | 6/2005 | Mercer et al. | ................ | 438/629 |

* cited by examiner

*Primary Examiner* — David Vu
*Assistant Examiner* — Jonathan Han
(74) *Attorney, Agent, or Firm* — Alan A. R. Cooper; Frederick J. Telecky, Jr.

(57) ABSTRACT

One embodiment relates to an integrated circuit that includes at least one semiconductor device. The integrated circuit includes a first contact associated with a first terminal of the semiconductor device. The first contact spans a dielectric layer and couples the first terminal to an interconnect line that communicates signals horizontally on the integrated circuit, where the interconnect line has a first composition. The integrated circuit further includes a second contact associated with a second terminal of the semiconductor device. The second contact spans the dielectric layer and couples the second terminal to a landing pad to which a via is coupled, where the landing pad has a second composition that differs from the first composition. Other circuits and methods are also disclosed.

15 Claims, 26 Drawing Sheets

SEMICONDUCTOR INTERCONNECT

FIELD

The disclosure herein relates generally to semiconductor processing, and more particularly to an interconnect that provides a balance between good performance and small feature size.

BACKGROUND

Several trends presently exist in the semiconductor and electronics industry. Compared to prior generations of devices, modern devices are smaller and operate at lower power and higher frequencies. One reason for these trends is that personal devices are being fabricated to be relatively small and portable, thereby relying on a battery as their primary power supply. For example, cellular phones, personal computing devices, and personal sound systems are devices that are in great demand in the consumer market. In addition to being smaller and more portable, personal devices are also requiring increased memory and more computational power and speed. In light of these trends, there is an ever increasing demand in the industry for smaller and faster transistors used to provide the core functionality of the integrated circuits (ICs) used in these devices. The main reason to reduce circuit area is cost. Smaller die size implies more dies on a wafer. Consequently, if everything else remains the same, the cost per die is lower.

It can be appreciated that integrated circuits with more devices (i.e., having higher densities) tend to provide more functionality than integrated circuits with fewer devices (i.e., having lower densities). Accordingly, in the semiconductor industry there is a continuing trend toward manufacturing integrated circuits with higher densities. To achieve high densities, there are on-going efforts toward scaling down dimensions (e.g., at submicron levels) on semiconductor wafers. In order to accomplish such high densities, smaller feature sizes, smaller separations between features, and more precise feature shapes are required in integrated circuits fabricated on small rectangular portions of the wafer, commonly known as dies.

Generally speaking, integrated circuit designers organize transistors into standard cell libraries, where each standard cell within the library corresponds to a particular functional block. For example, one functional block could correspond to NOR functionality and another functional block could correspond to NAND functionality. These functional blocks provide designers with building blocks that they can tile together to achieve complex functionality. By re-engineering how features are arranged in standard cell libraries, higher densities can be achieved.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

One embodiment relates to an integrated circuit that includes at least one semiconductor device. The integrated circuit includes a first contact associated with a first terminal of the semiconductor device. The first contact spans a dielectric layer and couples the first terminal to an interconnect line that communicates signals horizontally on the integrated circuit, where the interconnect line has a first composition. The integrated circuit further includes a second contact associated with a second terminal of the semiconductor device. The second contact spans the dielectric layer and couples the second terminal to a landing pad to which a via is coupled, where the landing pad has a second composition that differs from the first composition.

To the accomplishment of the foregoing and related ends, the following description and annexed drawings set forth certain illustrative aspects. Other aspects, advantages and/or features may, however, become apparent from the following detailed description when considered in conjunction with the annexed drawings.

DETAILED DESCRIPTION

Figure 1A:
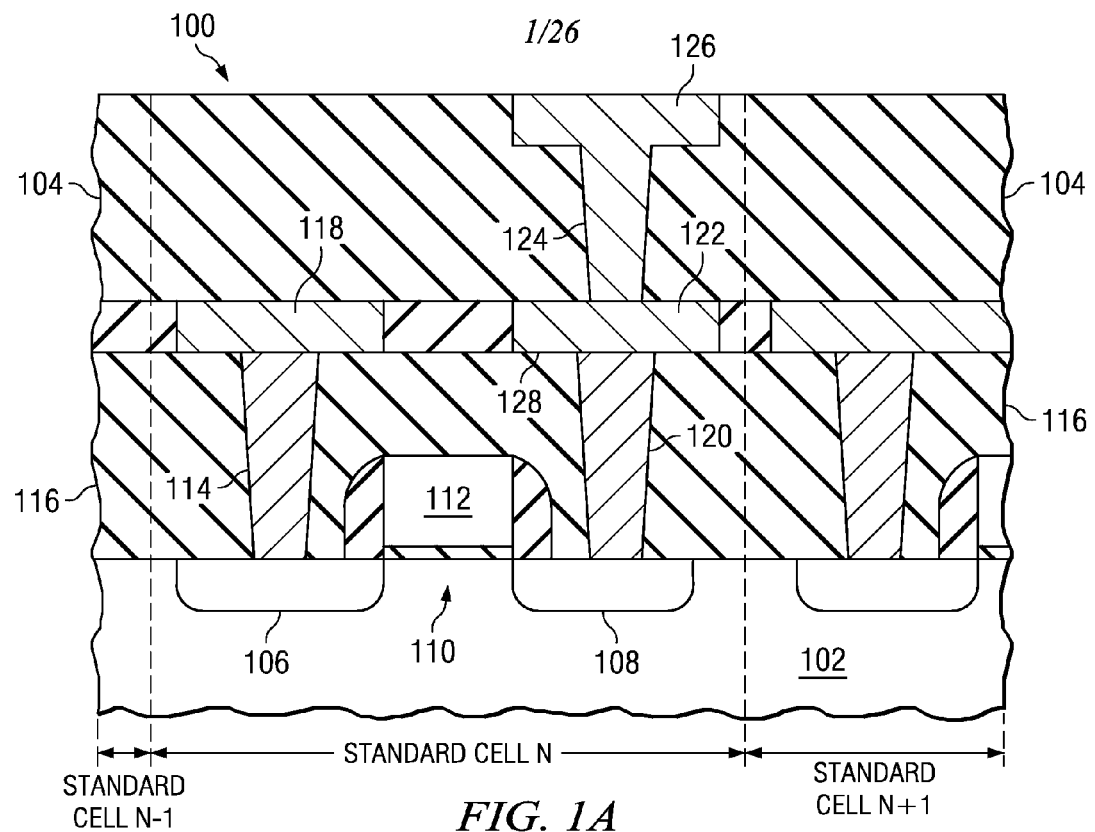
FIGS. 1A-1B are cross-sectional views of a transistor with a copper landing pad and copper interconnect line.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

FIG. 1A illustrates a semiconductor device 100 in the form of a metal oxide semiconductor field effect transistor (MOSFET). The MOSFET is formed in a semiconductor body 102 and has several layers of interconnect structure 104 fashioned thereover. The MOSFET includes several terminals to which biases can be selectively applied to operate the device. These terminals could include a source 106 and a drain 108 that are formed in the semiconductor body and are separated from one another by a channel region 110 under a gate electrode 112. The gate electrode 112 and the bulk region of the MOSFET (e.g., n-well) could also constitute terminals for purposes of this disclosure. The illustrated MOSFET also includes spacers laterally flanking the gate electrode and a gate oxide that separates the gate electrode from the channel region.

A first contact 114 spans a dielectric layer 116 to connect the source 106 to a metal1 interconnect line 118. The metal1 interconnect line 118, which is made of copper in one embodiment, typically carries signals between devices that are in separate areas of the integrated circuit. Thus, it may be advantageous to make the interconnect line out of low resistance material, such as copper, thereby limiting the resistance of the interconnect and potentially providing faster device switching times.

A second contact 120 also spans the dielectric layer 116 to connect the drain 108 to a metal1 landing pad 122. The landing pad 122 may differ from the interconnect line 118 in that the landing pad typically does not carry signals horizontally between devices, but rather serves as a vertical connection so the second contact 120 can be coupled to a via 124. The via 124 may include a via top 126, which may be a landing pad for connecting to another via (not shown). Alternatively, the via top 126 may be an interconnect line that carries signals horizontally to other devices (i.e., laterally between devices or into the plane of the page between devices).

Figure 1B:
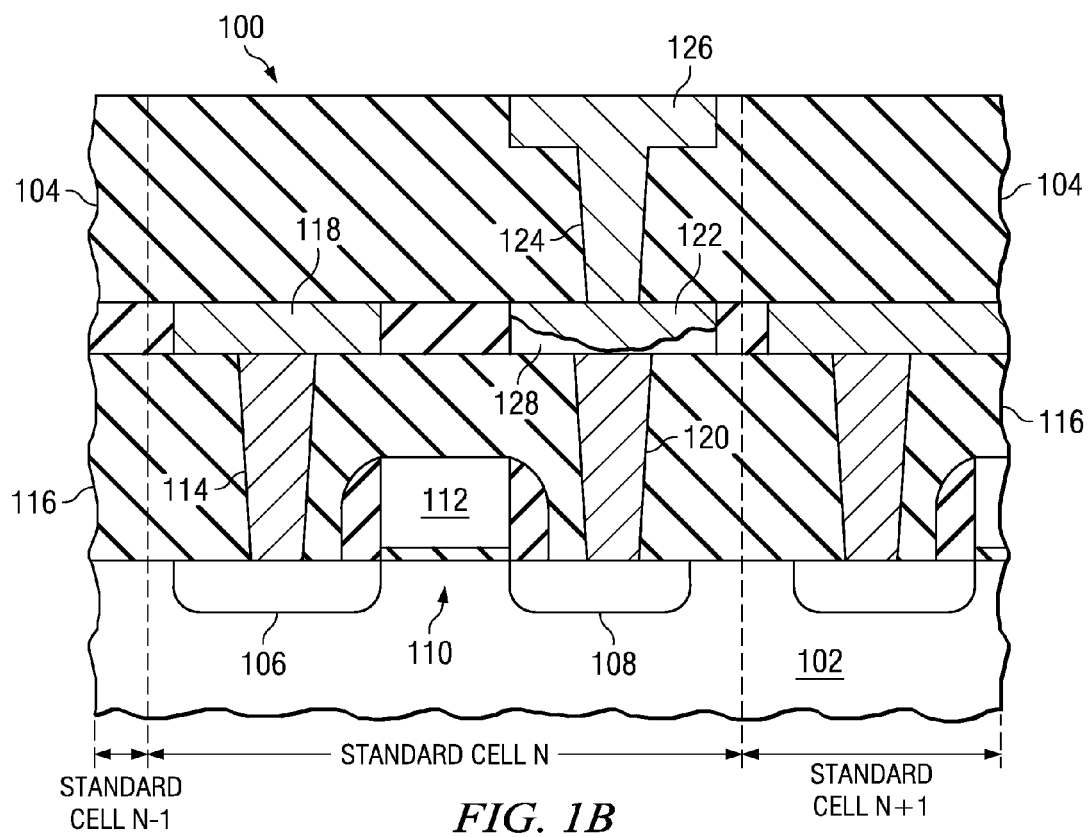

To limit the number of process steps and correspondingly limit manufacturing costs, the landing pad 122 could be made of the same material as the interconnect line 118. As mentioned, copper is often the material of choice due to its low resistance. In state-of-the-art technologies the minimum area of a copper pad is not limited by the lithographic and etch process capabilities to form the small trench which would be filled with copper but is limited by the ability to fill the trench with copper without voids, however, due to the fact that the copper electroplating process does not fill small openings particularly well. As attempts are made to shrink the feature sizes, voids 128 may appear during processing as shown in FIG. 1B. These voids may cause failures, thereby reducing manufacturing yields; or may greatly reduce reliability causing the circuit to fail when current flows through a partial void at a later time. Although FIG. 1B shows one type of void, it will be appreciated that FIG. 1B is only presented for purposes of understanding and that other types of voids, such as keyhole voids, could remain after processing or could occur during subsequent use (e.g., due to electromigration).

Figure 2:
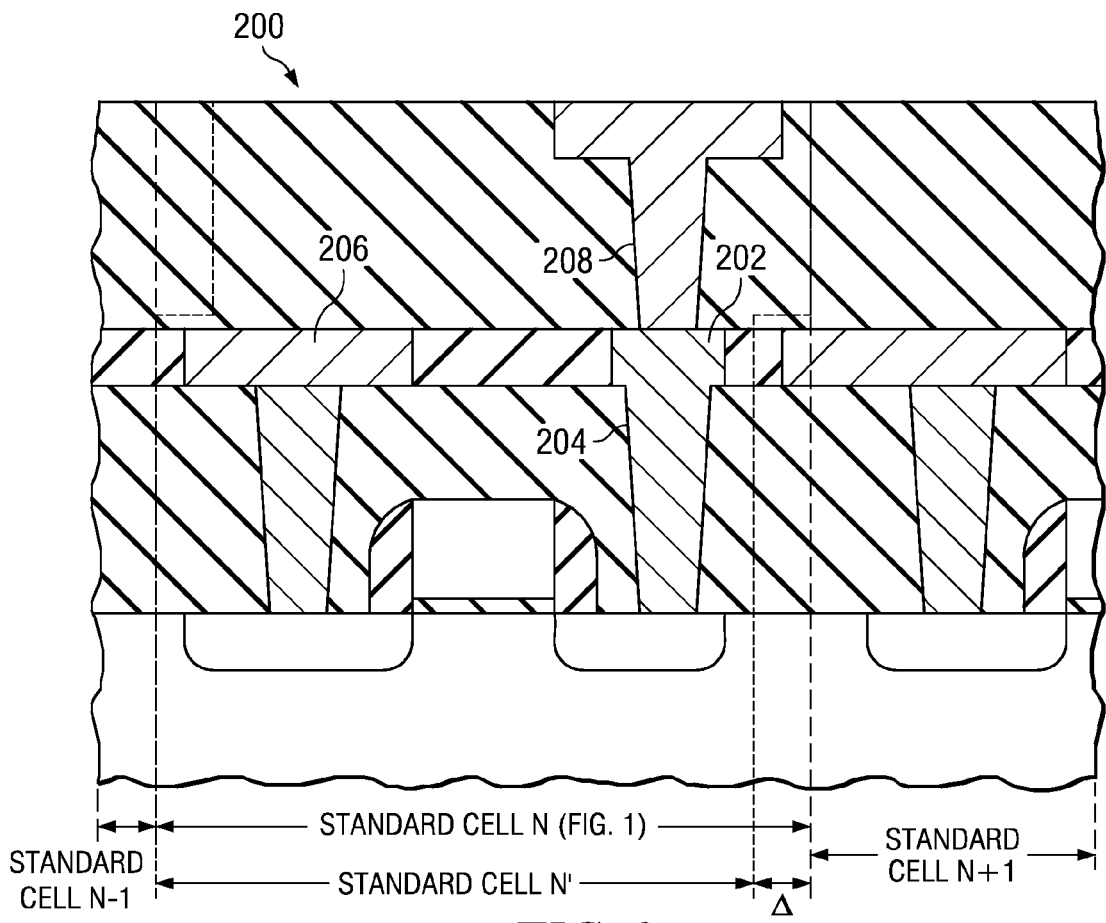
FIG. 2 is a cross-sectional view of a transistor that includes a landing pad with a relatively small area.

FIG. 2 shows one example of a configuration 200 that can limit the formation of voids, while at the same time providing high-performance (low resistance) interconnect lines and providing a mechanism for scaling to smaller standard cell areas. To achieve this balance, this configuration 200 includes a metal1 landing pad 202 that is formed continuously with its associated contact 204. In some embodiments, the metal1 landing pads 202 and the metal1 interconnect lines 206 may have different compositions. In these and other embodiments, the metal1 landing pads and metal1 interconnect lines could also have different areas and/or widths.

Depending on the specific implantation, this configuration 200 could provide varying degrees of balance between good performance and small area. This balance may be achieved in part due to the fact that the metal1 landing pads 202 and metal1 interconnect lines 206 could have different compositions. In some embodiments, for example, the metal1 interconnect line 206 could be made of copper or some other low-resistance material. Therefore, the configuration 200 can provide low-resistance interconnect lines between devices. In addition, however, the landing pad 202 could be made out of a ductile material, such as tungsten, which is deposited using a CVD process that can fill a relatively small area that electroplated copper would be unable to fill. Therefore, "voiding" can be eliminated and the area of the standard cell may be further scaled beyond what has been possible with copper. For example, in FIG. 2's illustrated embodiment, Standard Cell N' has "squeezed" width □ from the Standard Cell N. This area reduction can be significant when applied to an entire integrated chip, which could include thousands or even millions of standard cells.

Even if the ductile material for the landing pad 202 has a relatively high resistance, the degradation in switching time performance is often relatively small because signals travel only vertically across the landing pad 202 (i.e., from the contact 204 to the via 208, and vice versa). Thus, the landing pad 202 does not typically carry signals for long distances between devices and therefore, the reduction in area outweighs the slight degradation due to any added resistance. In embodiments where the metal1 interconnect lines 206 are still made of copper, fast switching times can still be achieved.

Thus, the inventors have appreciated that, by using different materials to fill the trenches and the small landing pads, the area of the landing pad can be shrunk to correspond to the limits of state-of-the-art lithographic and etch processes without forming undesirable voids. The inventors have also appreciated that the state-of-the-art deposition processes for conductive materials that are used to fill contact holes, (e.g., Ti/TiN/W), can also be used to fill the smallest landing pad trenches that can be patterned and etched. In addition, in some embodiments, the present invention may reduce contact resistance, especially in instances when the metal-1 trench and contact areas do not coincide due to processing misalignment between adjacent layers. The invention also enables reduction of the minimum metal-1 enclosure for contact design rules for the same reason.

Several illustrative examples of integrated circuits and manufacturing methods are now set forth below. Some figures (FIG. 3, FIG. 14, FIG. 22, and FIG. 32) show methods as flowcharts, while other figures (FIGS. 4-13, FIGS. 15-21, FIGS. 23-31, and FIGS. 33-43, respectively) show various cross sectional views that could correspond to the blocks of the respective flowcharts. Although these methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated.

Figure 3:
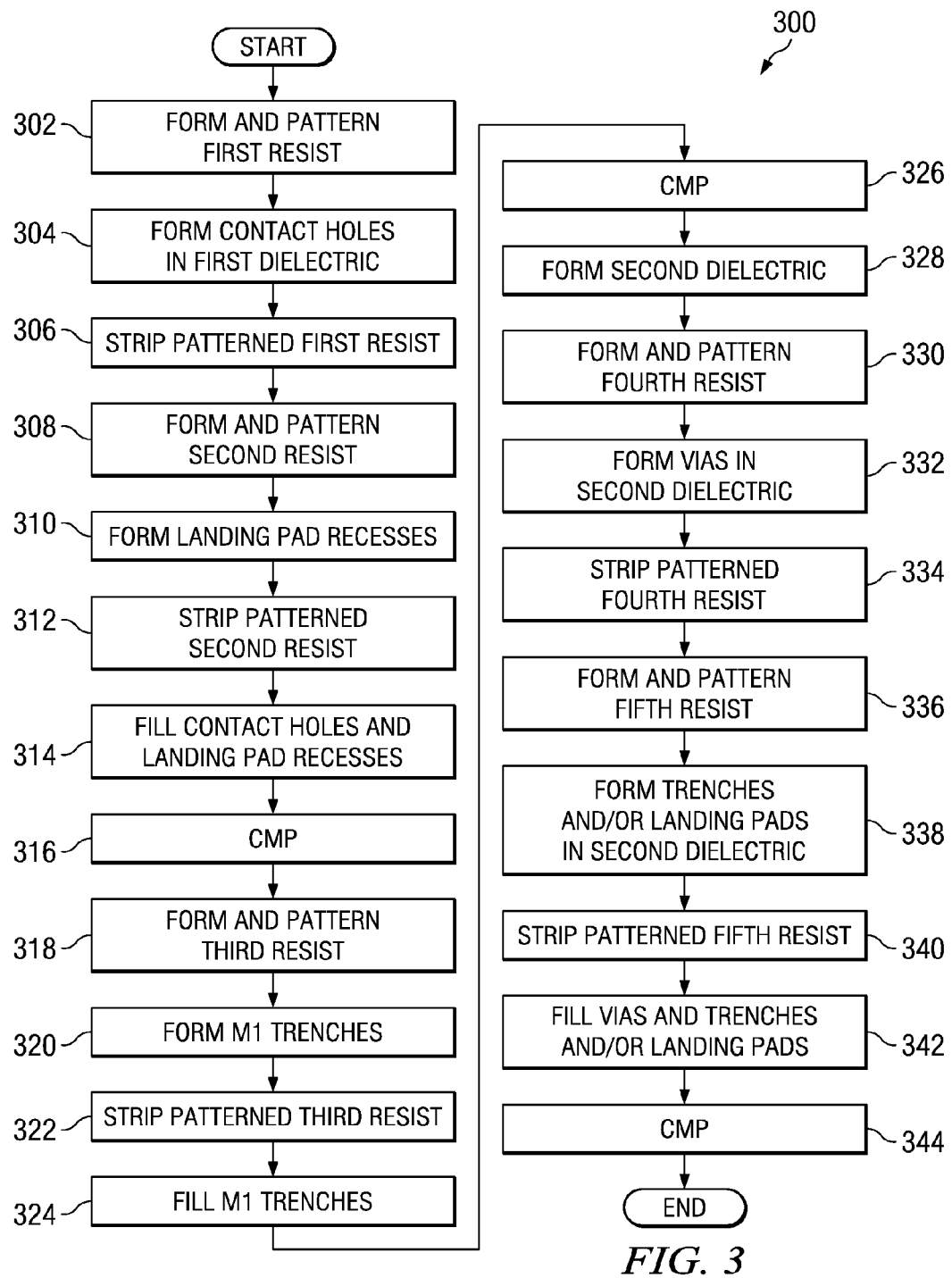
FIG. 3 is a flowchart that illustrates an embodiment of a method for forming a semiconductor device interconnect.

Referring now to FIG. 3 one can see a flowchart 300 for forming landing pads with a reduced width. Generally speaking, the flowchart illustrates blocks where alternating conducting and insulating layers are deposited over a semiconductor body to form an interconnect. The features within the layers are formed by patterning photoresist (resist) to expose some areas while masking off other areas. The exposed areas are then etched away and the patterned resist is then removed. Conductive features, such as contacts and vias are then formed to make the interconnect. Chemical mechanical polishing (CMP) is used to planarize the top surface of the structure at various blocks in the process.

Referring now to FIGS. 4-13, one can see several cross-sectional views during the manufacture of the device. These cross sections are but one example of a method corresponding to the flowchart of FIG. 3, and other examples are also possible. For purposes of clarity and simplicity, these cross-sectional views do not explicitly show all blocks of the flowchart. For example, patterned resist layers (masks) are not shown, nor are CMP blocks.

Figure 4:
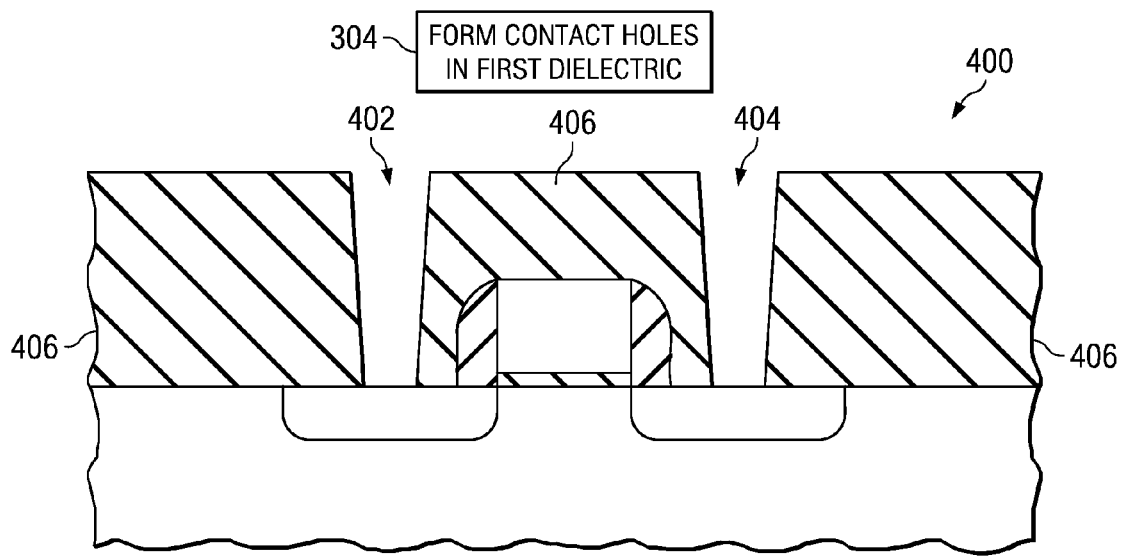
FIGS. 4-13 are cross-sectional views of a more detailed implementation of the embodiment of FIG. 3.

Referring now to FIG. 4, one can see a structure 400 in which first and second contact holes 402, 404 have been formed in the first dielectric layer 406. For example, these contact holes 402, 404 could be formed by using reactive ion etching (RIE).

Figure 5:
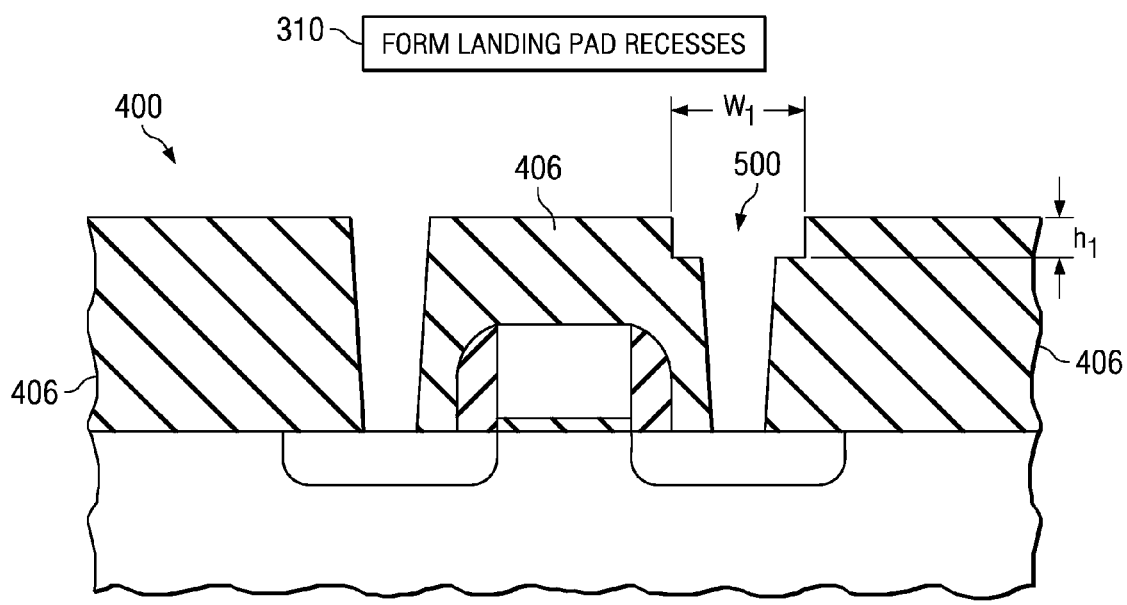

In FIG. 5, a landing pad recess 500 has been formed near the top of the second contact hole. To form this recess, a photoresist mask could be formed over the top surface of the first dielectric layer to expose the region where the recess is to be formed. A selective etch that is selective between the first dielectric layer 406 (e.g., oxide) and the source (e.g., silicon) can then be used to form the landing pad recess. As shown, the landing pad recess has a width $w_1$, and a depth $h_1$. The width $w_1$ should be sufficiently large to allow proper alignment of a via over a landing pad to be formed in the recess 500.

Figure 6:
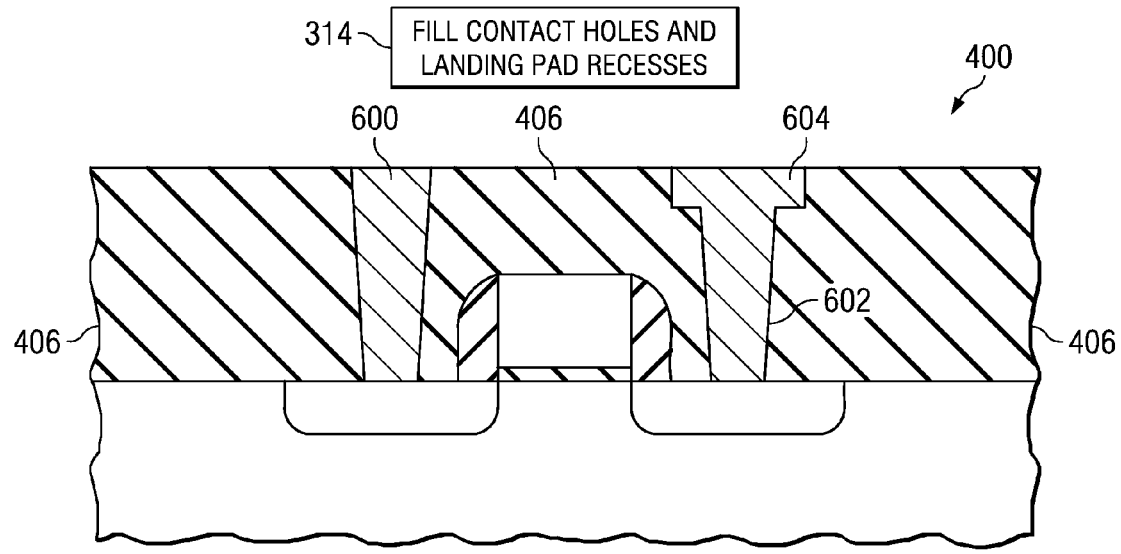

In FIG. 6, the contact holes and the landing pad recesses have been filled (and CMP performed) to form a first contact 600 and a second contact 602, where the second contact 602 has a landing pad 604 near the top thereof. In one embodiment, the fill process could include multiple steps, namely, forming a liner layer, and then depositing fill material to fill the holes. The liner layer could be titanium (Ti)/titanium nitride (TiN), where a thin layer of titanium is usually first deposited and then titanium nitride is deposited to act as a barrier between the fill material and the silicon. In one embodiment, after the liner layer has been formed, tungsten could be used to continuously fill the contact holes and landing pad recesses. The tungsten could be deposited by chemical vapor deposition (CVD), atomic layer deposition (ALD), combinations of CVD and ALD, or other suitable mechanisms. Because the gaseous CVD process can fill smaller geometries more easily than electroplating, the area of the landing pad (e.g., which relates to width $w_1$) can be smaller than more conventional landing pads where electroplated copper is used. In other embodiments, other metals such as aluminum could be used for the fill material for the contact holes and landing pad recesses.

Figure 7:
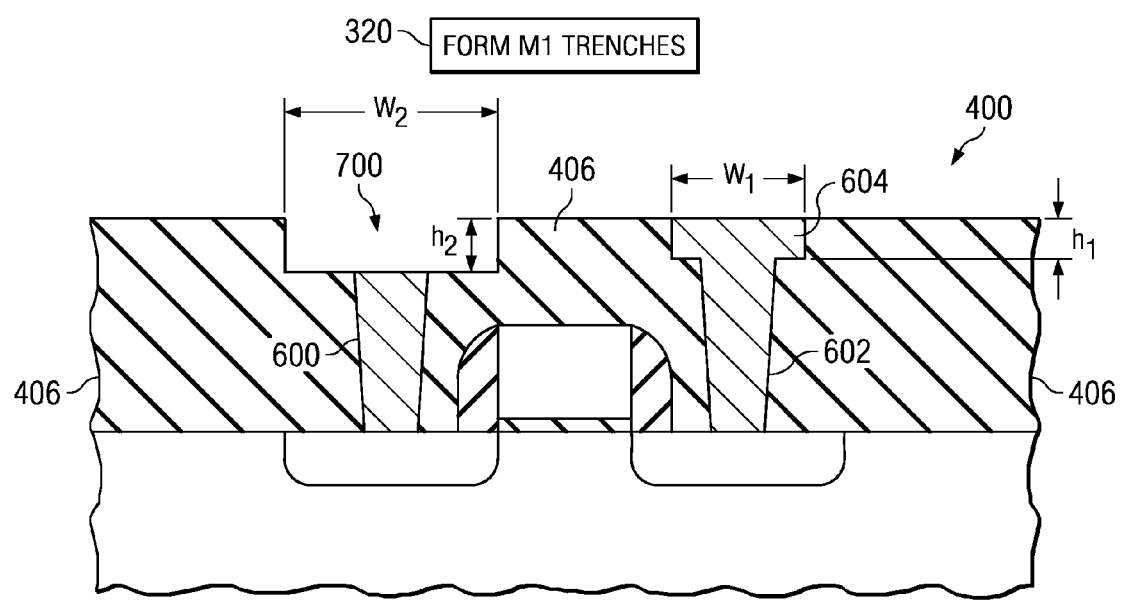

FIG. 7 shows a structure after metal1 interconnect trenches 700 have been formed. Often, a series of etches may be used to form the metal1 interconnect trenches 700. For example, one etch could etch the first dielectric layer 406 and another could etch the fill material of the first contact 600. The metal1 interconnect trenches 700 have a width, $w_2$, and a height, $h_2$. The area associated with the metal1 interconnect trenches 700 (which relates to width w2) is often greater than the area associated with the landing pad 604 (which relates to width w1). Therefore, the landing pad width w1 will often be larger than the interconnect line width w2, but because the second dimension of the interconnect line could be much larger than the second dimension of the landing pad, the area of the line is much larger than the area of the pad so does not present a problem to the copper electroplating process.

In addition, the height $h_2$ could often be different from height $h_1$, although it could be approximately the same as height $h_1$. In other embodiments (not illustrated), the dielectric layer 406 may be removed and the fill material of the contact 600 may be left standing in the trench recess 700, consequently leaving a "pillar" of first contact material in the trench.

Figure 8:
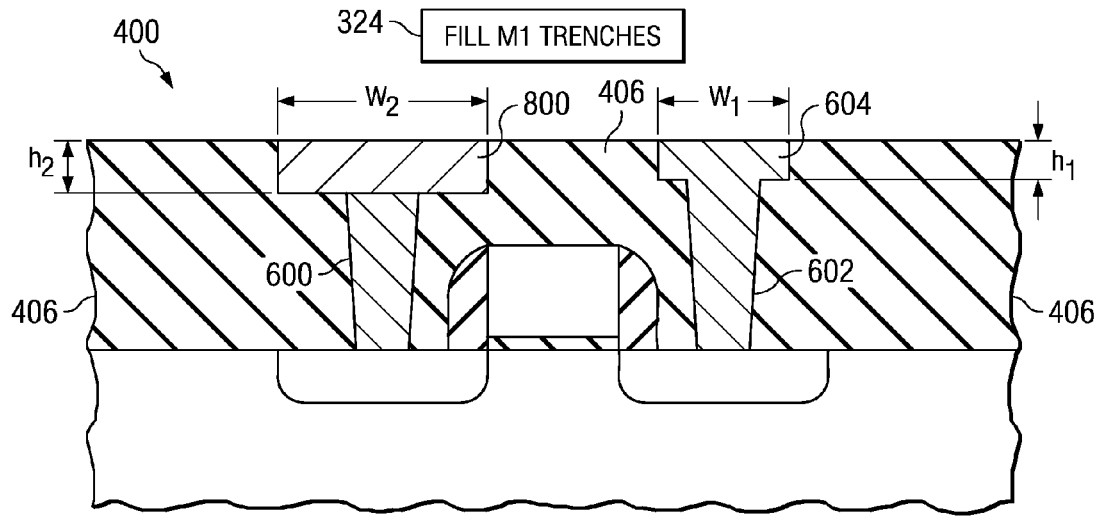

In FIG. 8, copper or another material has been deposited or grown in the metal1 interconnect trench 700 to form a metal1 interconnect line 800. As previously mentioned, this metal1 interconnect line could carry signals into the plane of the page between devices. This allows low resistivity copper (or other materials) to be used for the metal1 interconnect lines.

One method for forming the copper is now discussed. First, a thin Cu seed layer is deposited using PVD. Cu electroplating is then performed. If the aspect ratio of the trench (depth/width) is high then the seed layer thickness may get thin along the bottom edges of the trench. If the seed layer is not continuous, then electroplating may fail. The seed deposition thickness can be increased to counter this. However, as the seed layer thickness is increased, the opening near the top of the trench may be pinched off. At some point, the opening will be too small to allow the electroplating chemicals to enter and a void may occur. These problems can be solved by reducing the aspect ratio or by reducing the trench depth. However, that comes with the penalty of higher sheet resistance.

More specifically, there are several types of voids that may occur. One type of void (seams) may occur if there is a long, wide trench which is easy to fill. As its width is reduced, at some point the aspect ratio will be such that the seed layer at the top will pinch the opening leading to a void lower down in the trench during the Cu electroplating step. This void will be like a cylindrical hole along the length of the trench. During subsequent curing this void moves up and forms a seam running along the length of the trench. This happens to be a low energy state for the system. Often, these seams are undesirable but detectable, stable, and not a reliability problem. Another type of void (bubbles) may occur when a long, narrow trench has its length reduced. At some point when the length is almost as small as the width, the seed layer pinches the opening from all sides. This time the void in the Cu after electroplating is more like a bubble. During curing, this spherical void moves to the bottom of the trench, and may result in very thin Cu (perhaps even a gap) near the bottom of the trench. Thus, as the current flows vertically from the contact into the landing pad or interconnect line, the current density is high and results in instability and gap formation. This may be a serious early failure rate (EFR) and reliability problem. Therefore, even though narrow trenches are as difficult to fill, they can be acceptable in the design as long as their length is above a critical value so that a seam is formed instead of bubble-like voids at the bottom. In typical technology nodes, this may limit the minimum area of a Cu landing pad.

Figure 9:
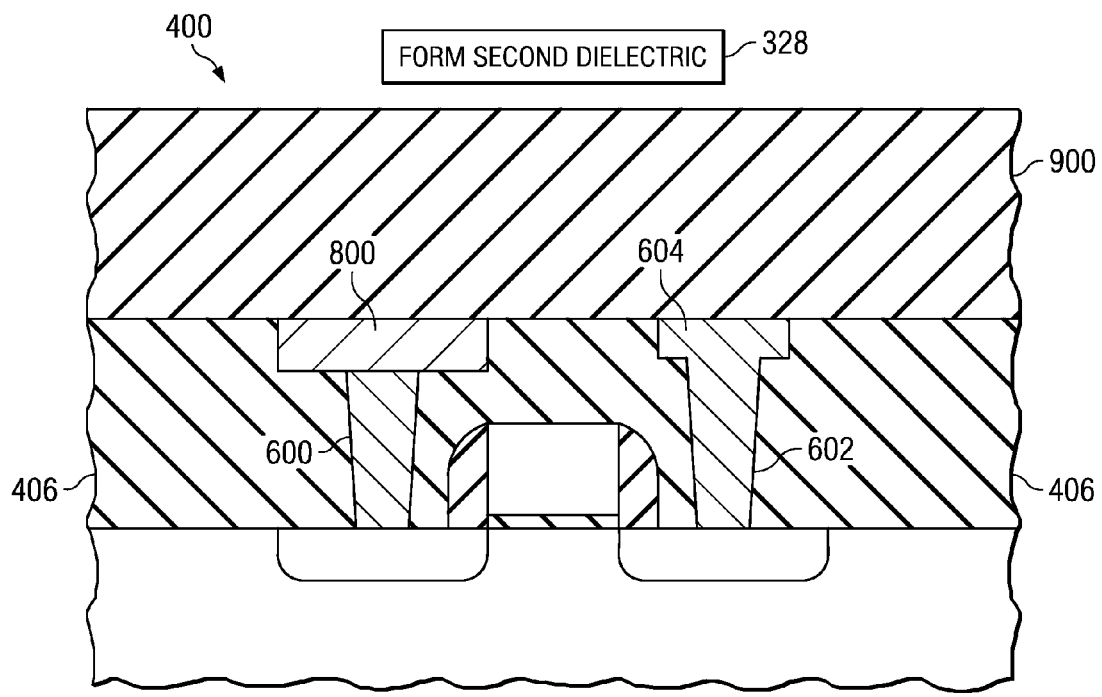

In FIG. 9 a second dielectric layer 900 has been formed over the top surface of the existing structure.

Figure 10:
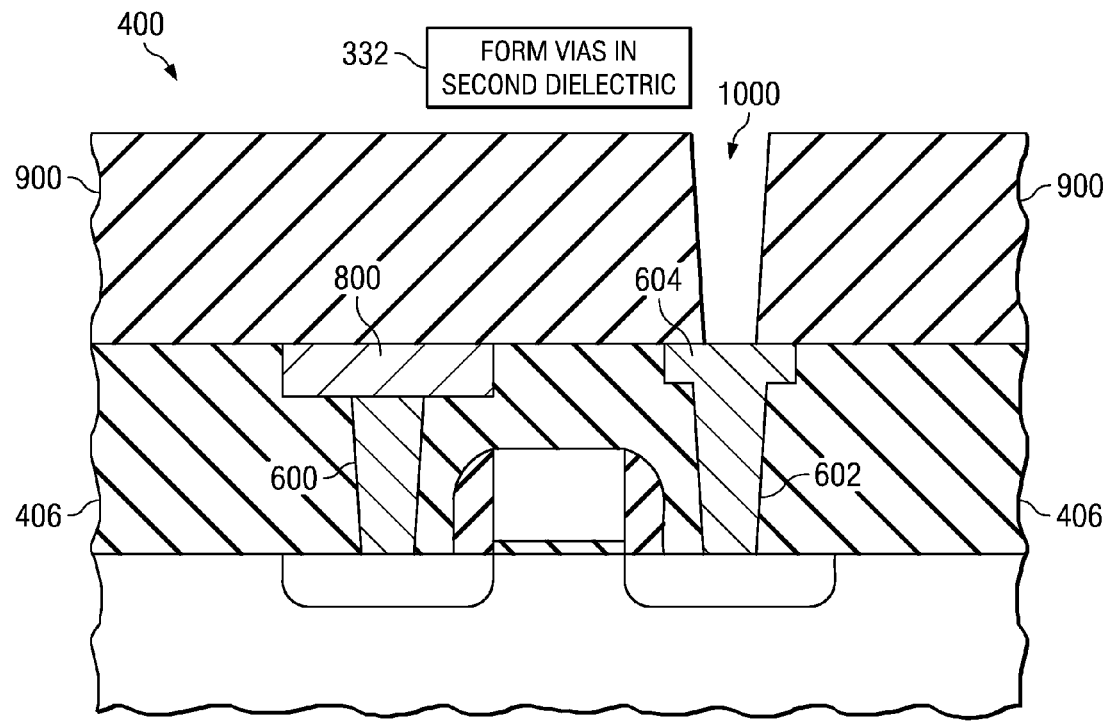

In FIG. 10, after photoresist has been patterned, via holes 1000 are formed in the second dielectric layer 900 so as to coincide with the landing pads 604.

Figure 11:
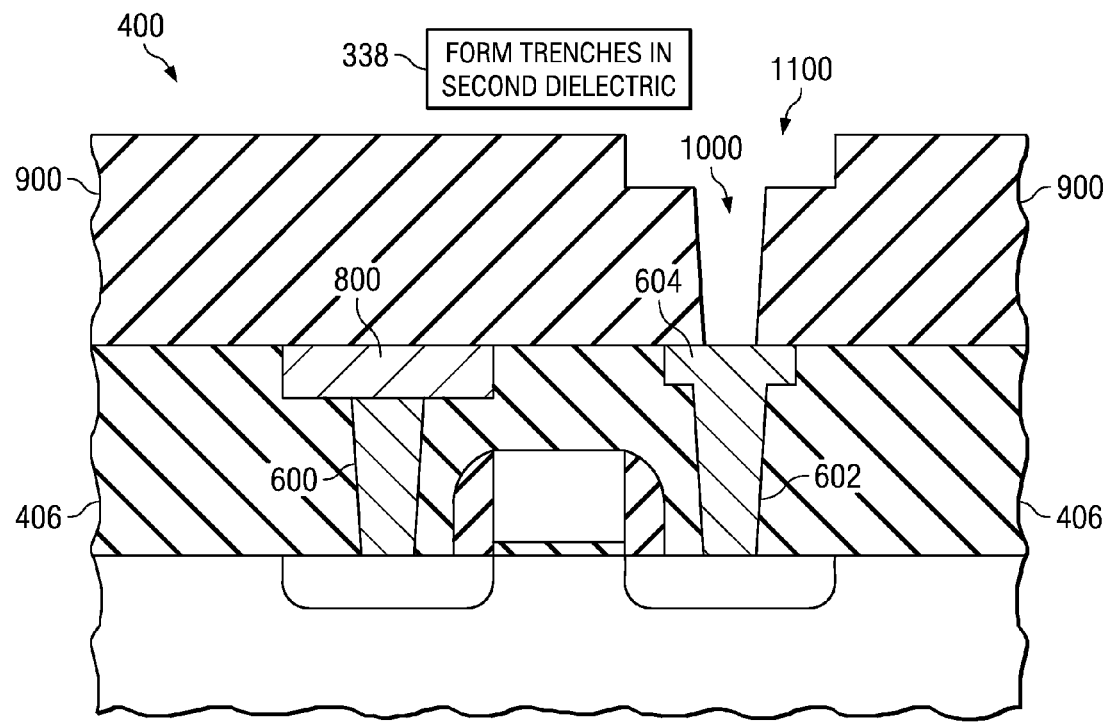

In FIG. 11, metal2 trenches or landing pad recesses 1100 are formed near the top of the via holes 1000.

Figure 12:
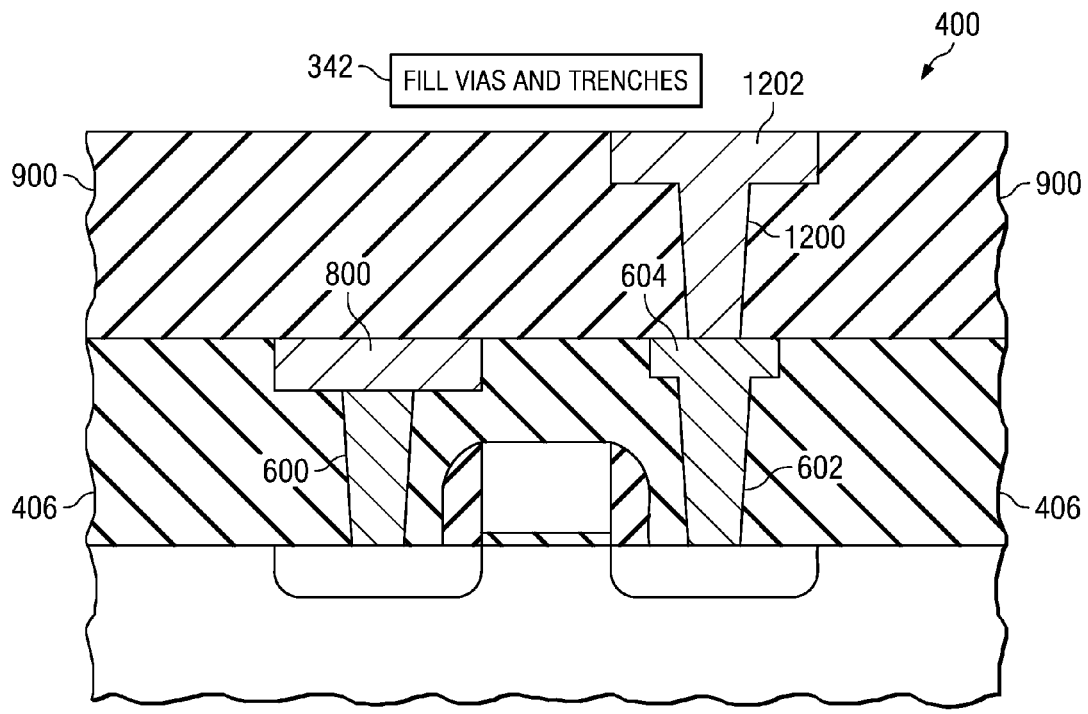

In FIG. 12, the via holes and metal2 trenches and/or landing pad recesses are filled, often with copper. Therefore, vias 1200 and metal2 interconnect lines and/or metal2 landing pads 1202 are formed. In some embodiments, upper layer landing pads could also be made with a reduced area in a manner similar to that of the landing pads in metal1. Additional layers of interconnect (e.g., metal3, metal4, etc.) could also be fashioned in this manner.

Figure 13:
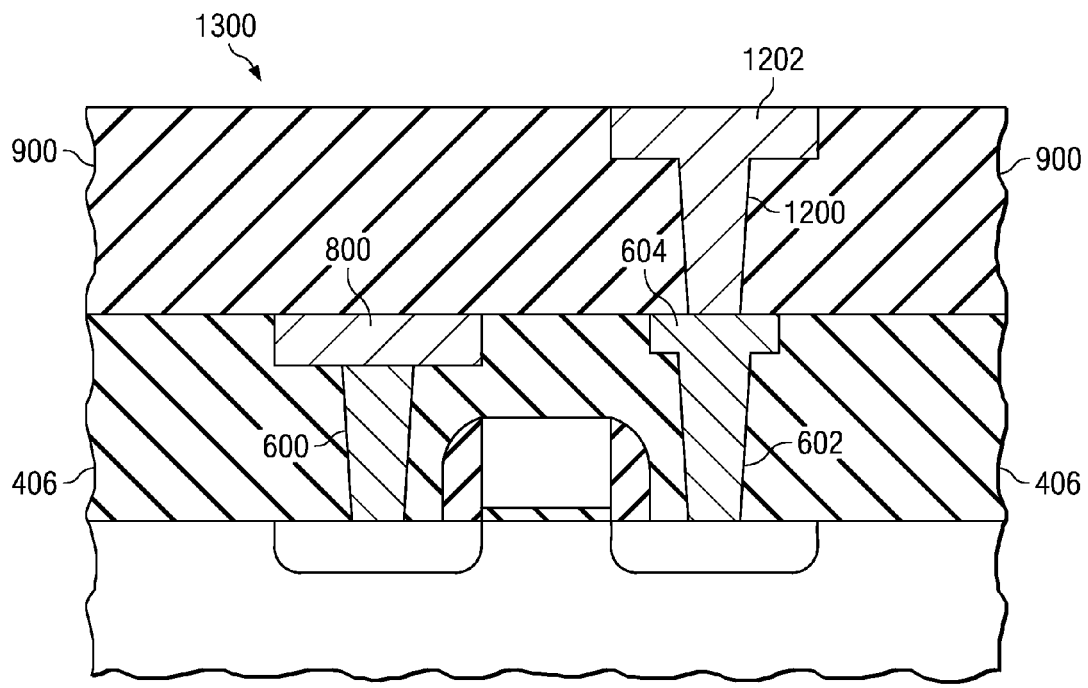

Therefore, FIG. 13 shows a manufactured device 1300. This configuration provides an excellent blend of cost and performance compared with previously discussed FIG. 1. The configuration still could provide relatively high performance because the metal1 interconnect line 800 could be made of copper. Thus, there could be relatively low-resistance metal1 interconnects between devices. Further, due the reduced area or width $w_1$ of the landing pad 604, the area of a standard cell may be reduced by an amount that relates to the number of landing pads in the standard cell. Even if the landing pad 604 is made of tungsten, which has a relatively high resistivity, the performance degradation due to the tungsten is relatively small because signals travel vertically across the landing pad 604 (i.e., from the contact 602 to the via 1200 and vice versa), and not horizontally between devices.

In some embodiments, relatively long interconnect lines could be made of copper while other (relatively short) interconnect lines could be made of tungsten. Thus, it will be appreciated that there are numerous combinations of materials for interconnect lines and landing pads that are encompassed by the present invention.

Figure 14:
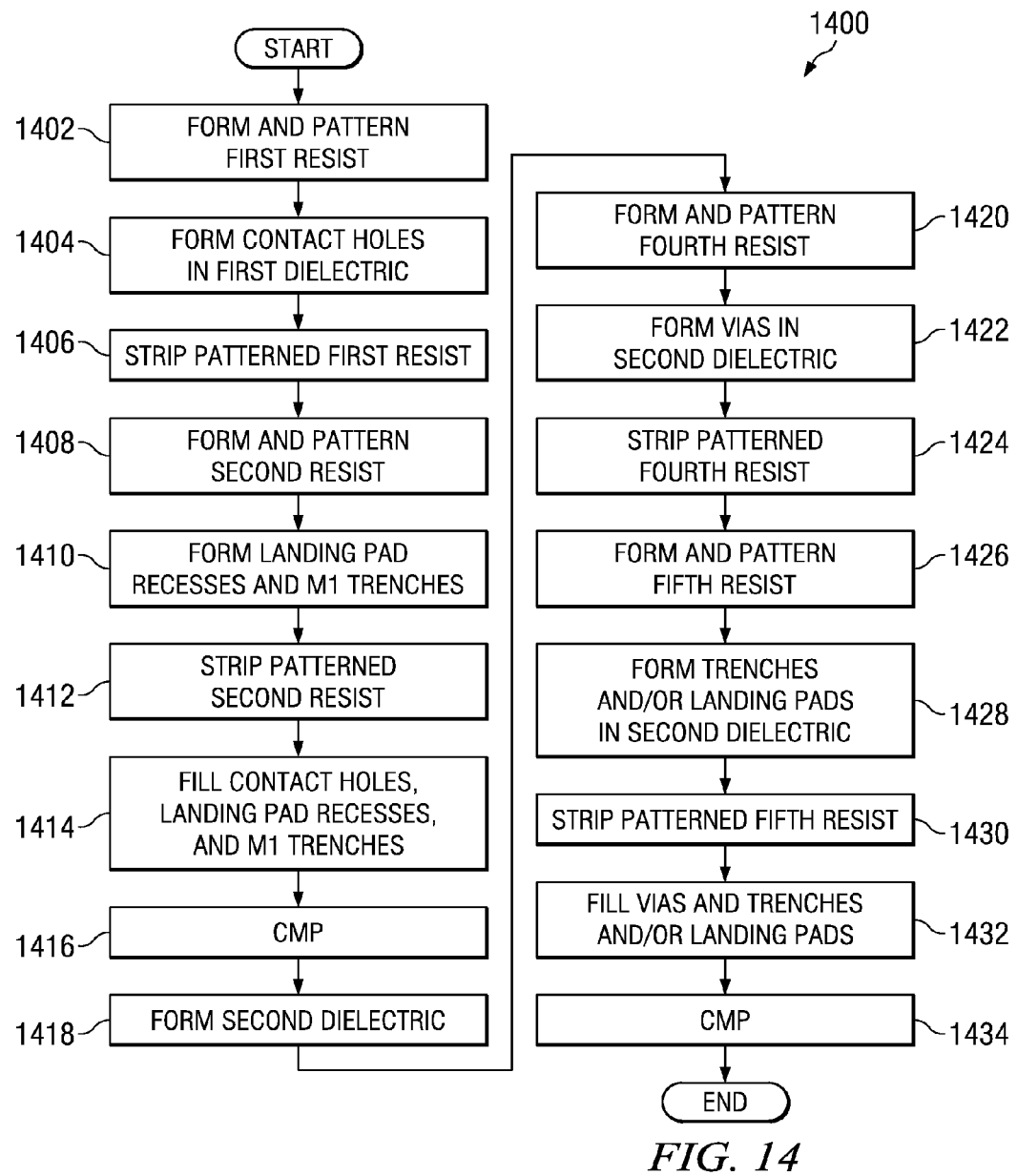
FIG. 14 is another flowchart that illustrates another embodiment of a method for forming a semiconductor device interconnect.

Referring now to FIG. 14, one can see another flowchart 1400 for forming landing pads with a reduced area. FIG. 14's embodiment differs from FIG. 3's embodiment in that in FIG. 14, the landing pads and metal1 interconnect lines are formed concurrently and have the same composition. By contrast, in FIG. 3 the landing pads and metal1 interconnect lines were formed in separate steps.

Referring now to FIGS. 15-21, one can see several cross-sectional views during the manufacture of the device. These cross sections are but one example of a method corresponding to the flowchart of FIG. 14, and other examples are also possible. For purposes of clarity and simplicity, these cross-sectional views do not explicitly show all blocks of the flowchart. For example, patterned resist layers (masks) are not shown, nor are CMP blocks.

Figure 15:
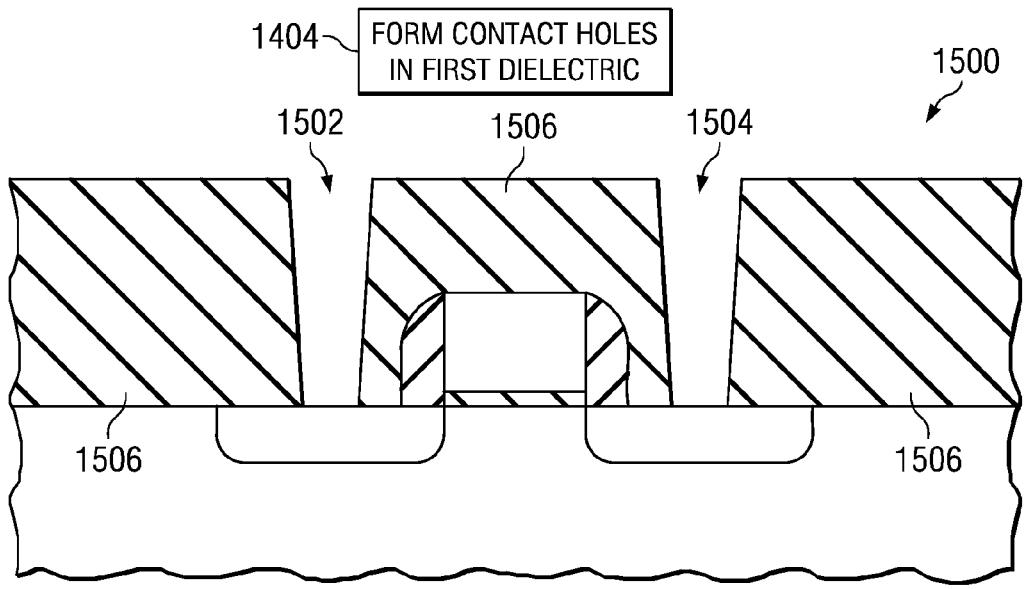
FIGS. 15-21 are cross-sectional views of a more detailed implementation of the embodiment of FIG. 14.

Referring now to FIG. 15, one can see a structure 1500 in which first and second contact holes 1502, 1504 have been formed in the first dielectric layer 1506. For example, these contact holes 1502, 1504 could be formed by using suitable etches as discussed above.

Figure 16:
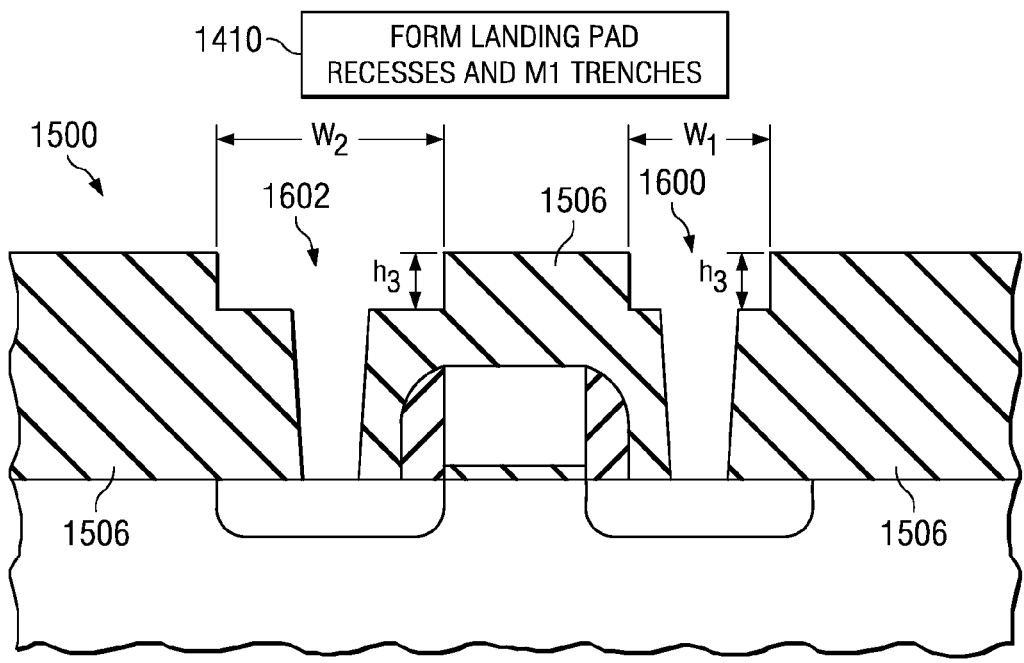

In FIG. 16, a landing pad recess 1600 has been formed near the top of the second contact hole 1504, and a metal1 trench 1602 has been formed near the top of the first contact hole. As shown, the landing pad recess has a width $w_1$, and a depth $h_3$. The width $w_1$ should be sufficiently large to allow proper alignment of a via over a landing pad to be formed in the landing pad recess 1600. The metal1 trench has a width $w_2$ and the depth $h_3$.

Figure 17:
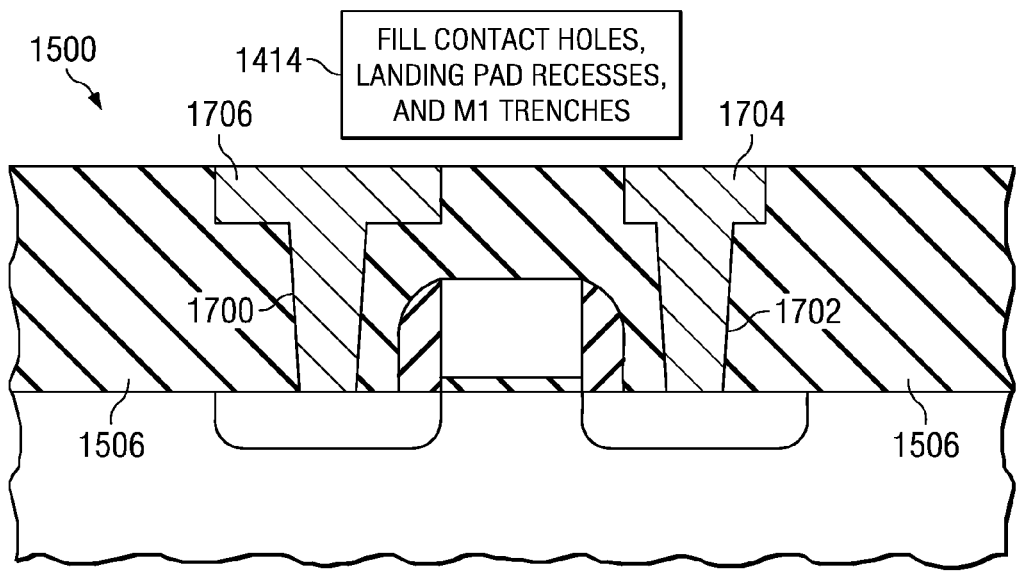

In FIG. 17, the contact holes, landing pad recesses, and metal1 trenches have been filled (and CMP performed) to form first and second contacts (1700, 1702, respectively), landing pads 1704, and metal1 interconnect lines 1706, respectively. In one embodiment, these features may be filled continuously, for example with tungsten. In other embodiments, the filling of these features may include multiple steps. For example, in one embodiment, this step could include deposition of a contact liner followed by metal deposition as previously discussed. Although the use of tungsten for the interconnect lines 1706 may result in higher resistance interconnect between devices compared to FIG. 3's flowchart, this embodiment is a more streamlined process and is therefore more cost-effective to implement. Other fill materials, such as aluminum, could also be used.

Figure 18:
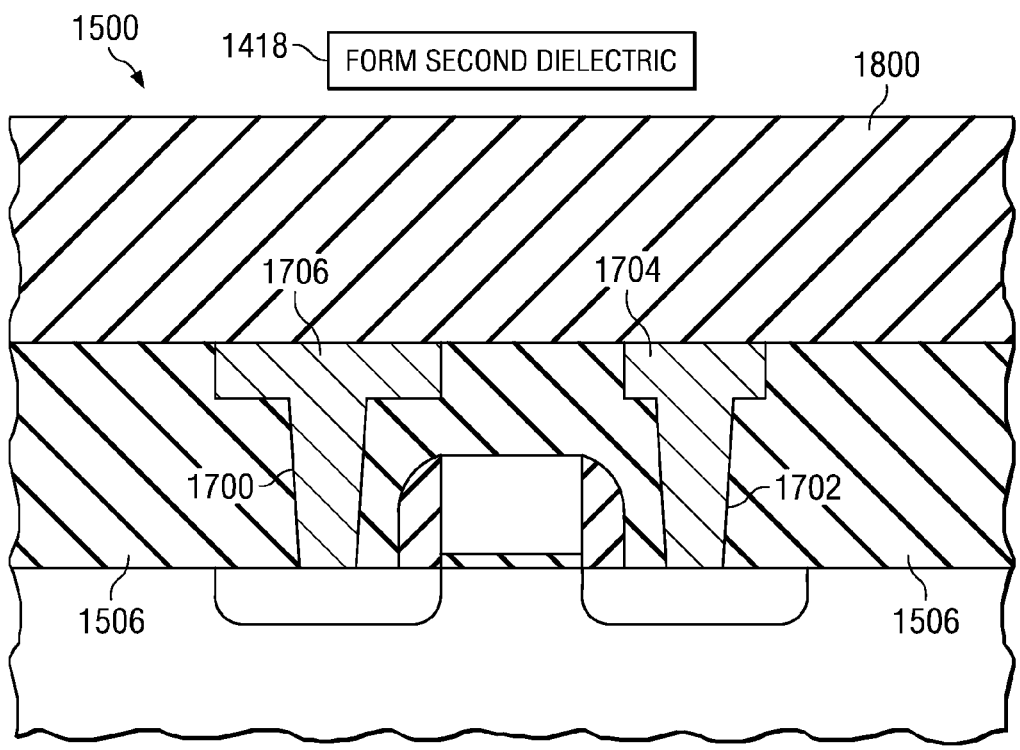

In FIG. 18 a second dielectric layer 1800 has been formed over the top surface of the existing structure.

Figure 19:
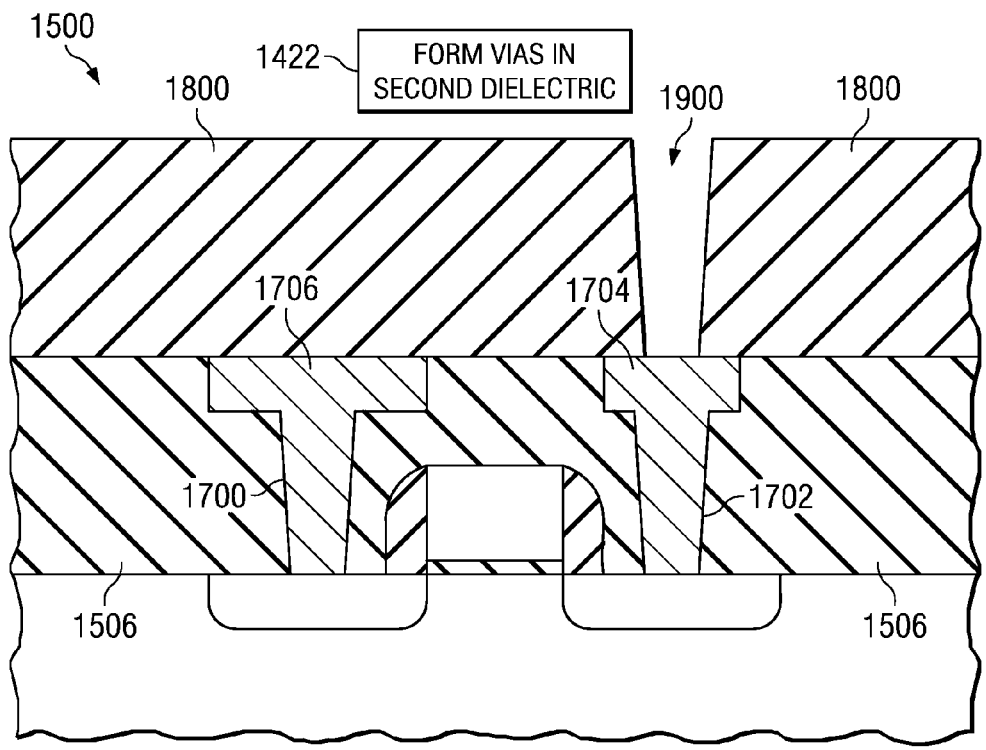

In FIG. 19, after photoresist has been patterned, via holes 1900 are formed in the second dielectric layer 1800 so as to coincide with the landing pads 1704.

Figure 20:
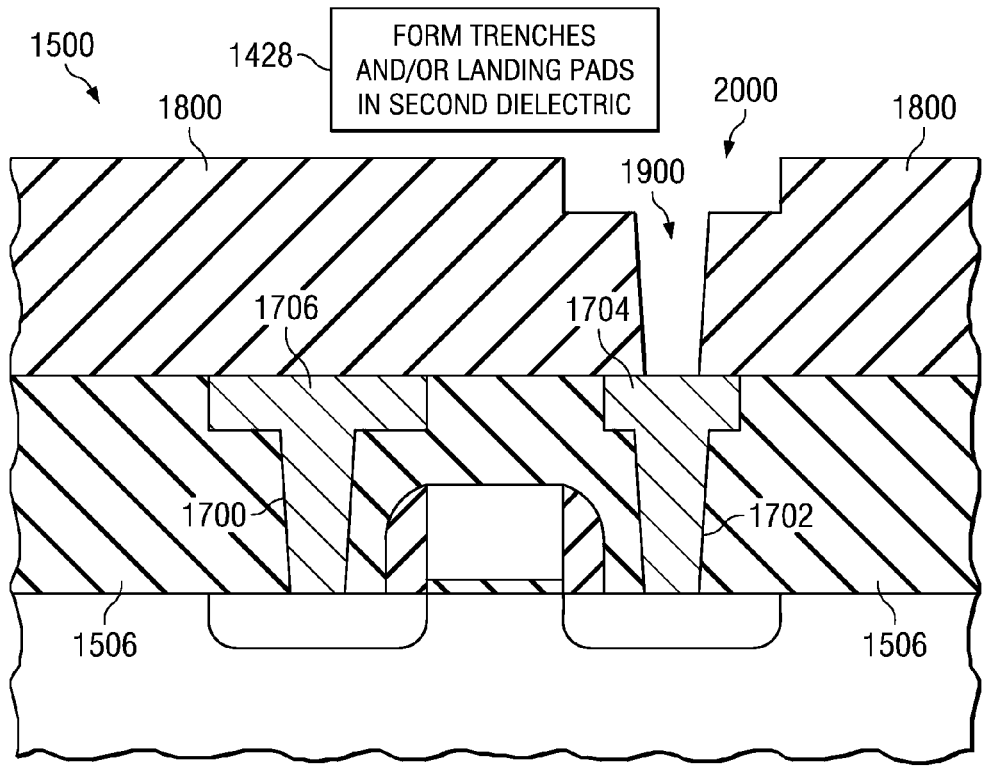

In FIG. 20, metal2 trenches or landing pad recesses 2000 are formed near the top of the via holes 1900.

Figure 21:
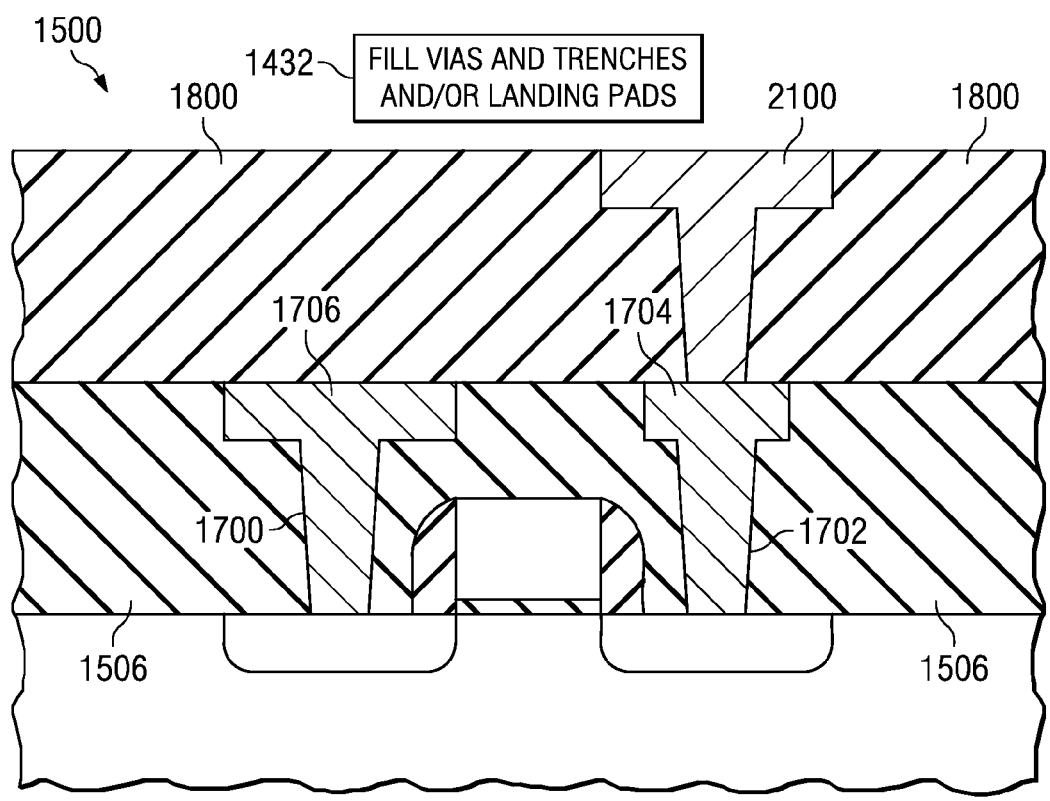

In FIG. 21, the via holes and metal2 trenches and/or landing pad recesses are filled, often with copper. Therefore, vias 2100 and/or metal2 interconnect lines and metal2 landing pads 2102 are formed. Additional layers of interconnect (e.g., metal3, metal4, etc.) could also be fashioned in this manner.

Figure 22:
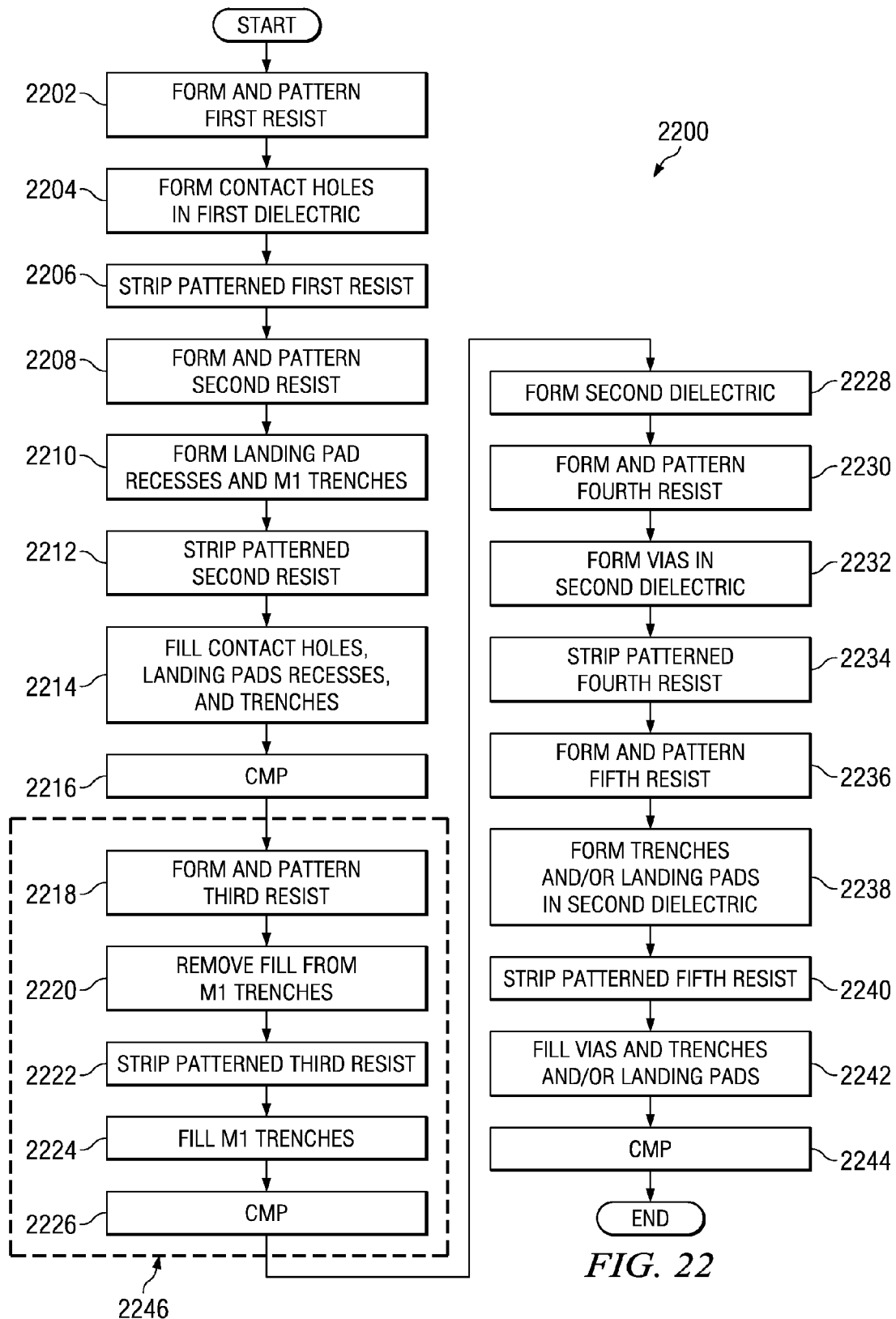
FIG. 22 is another flowchart that illustrates another embodiment of a method for forming a semiconductor device interconnect.
Figure 23:
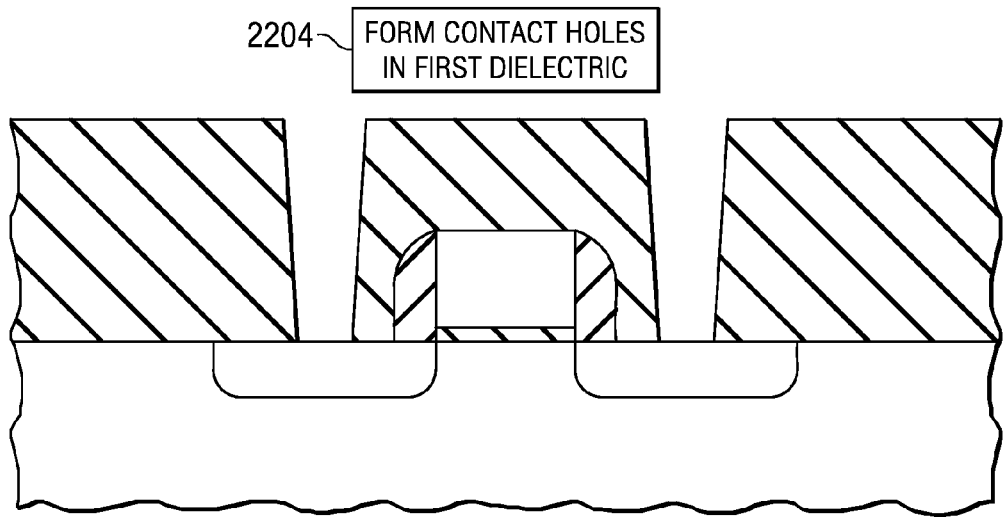
FIGS. 23-31 are cross-sectional views of a more detailed implementation of the embodiment of FIG. 22.
Figure 24:
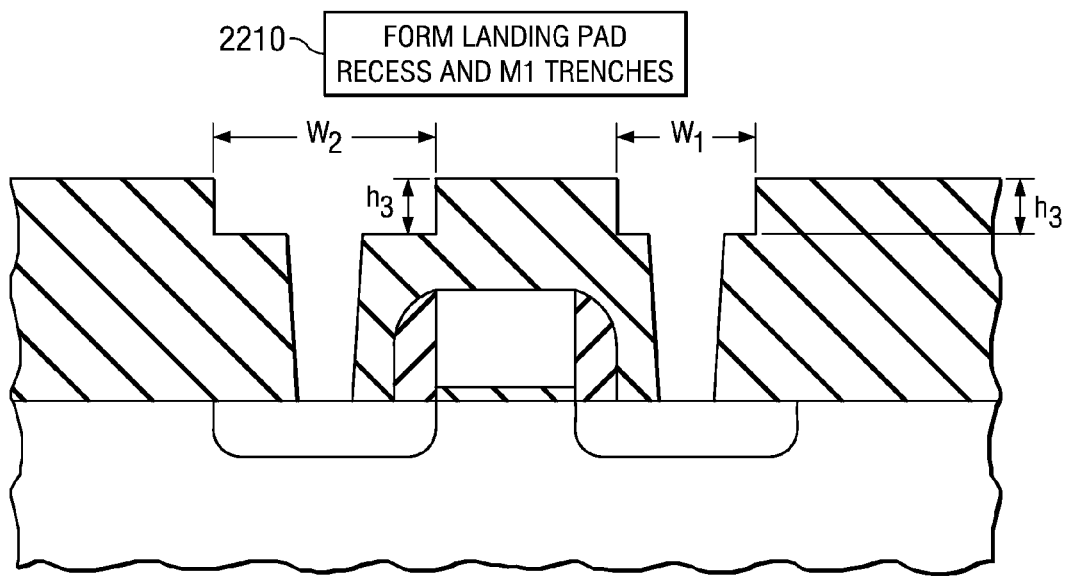
Figure 25:
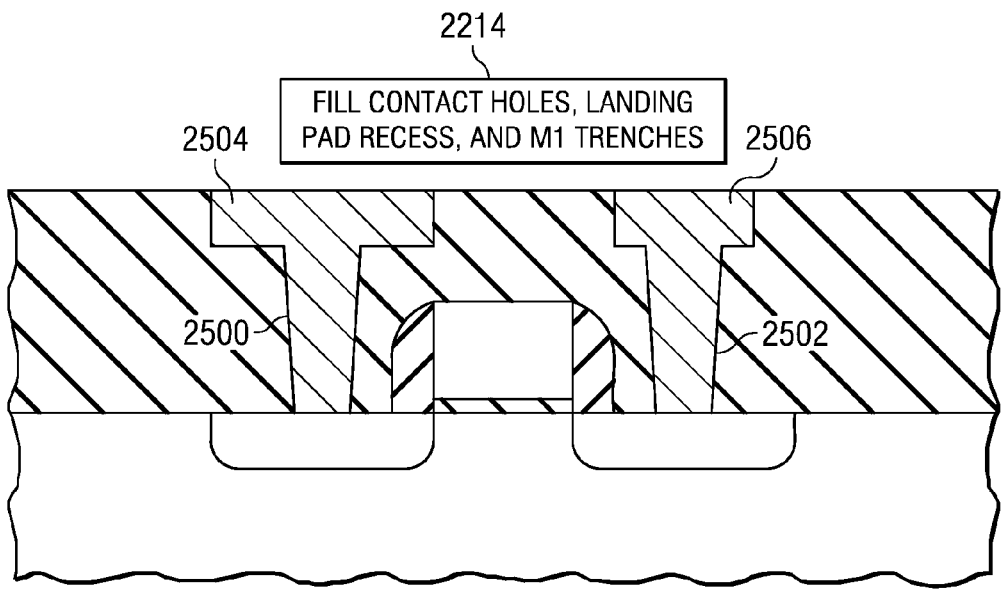

Referring now to FIG. 22 one can see another flowchart 2200 for forming landing pads with a reduced area. FIG. 22's embodiment is in some ways a blend of the previously discussed embodiments. The flowchart looks very similar to FIGS. 14-21, but includes some extra process steps which are in the boxed area 2246. For purposes of simplicity and clarity, only the extra processing steps are discussed below.

Figure 26:
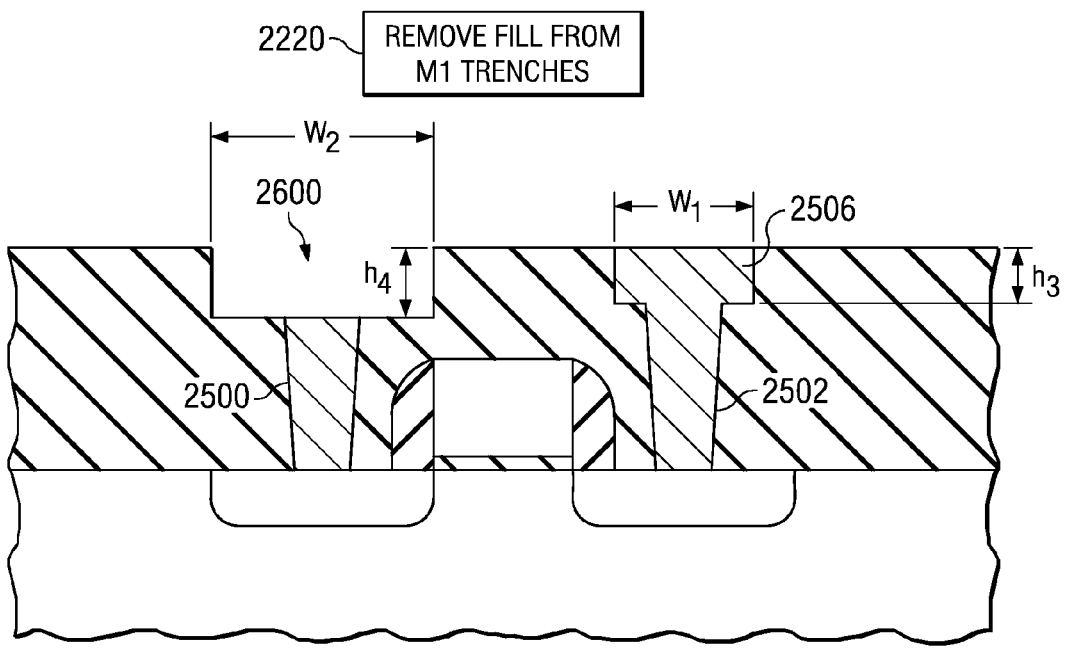

As shown in FIG. 26, after the contacts 2500, 2502, metal 1 interconnect lines 2504, and landing pads 2506 have been formed (see FIG. 25), the fill is removed from the metal1 interconnect lines to form a metal1 trench 2600. To remove the fill material, a photoresist mask (or other mask) is used to cover the landing pad 2506. Often, the top of the first dielectric layer will also be covered to expose only the interconnect line 2504. After the mask has been patterned, the interconnect line will be removed to form the metal1 trench 2600 with a width $w_2$ and height $h_4$ that may differ from height $h_3$.

Figure 27:
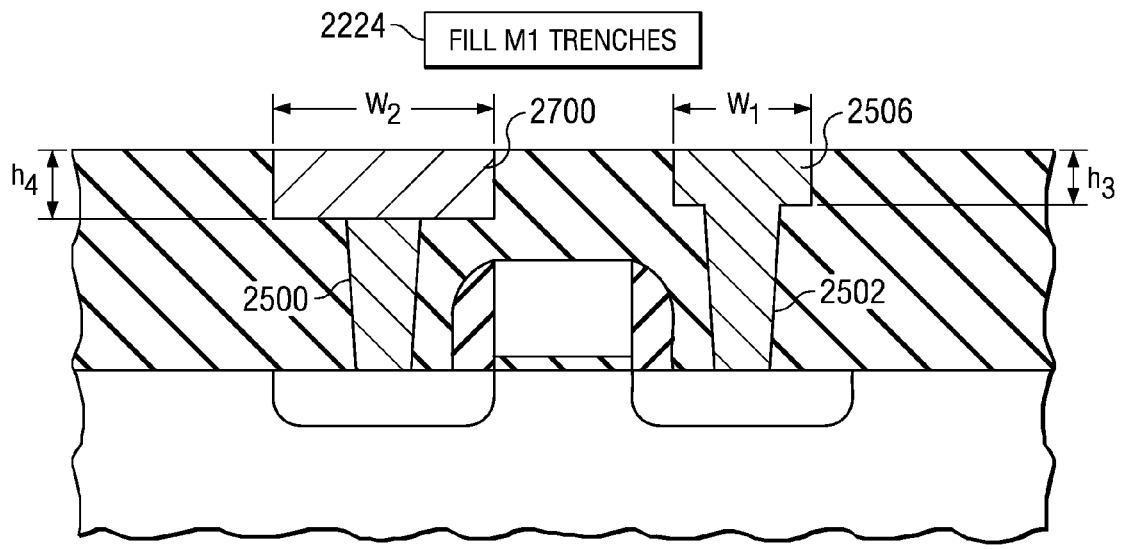
Figure 28:
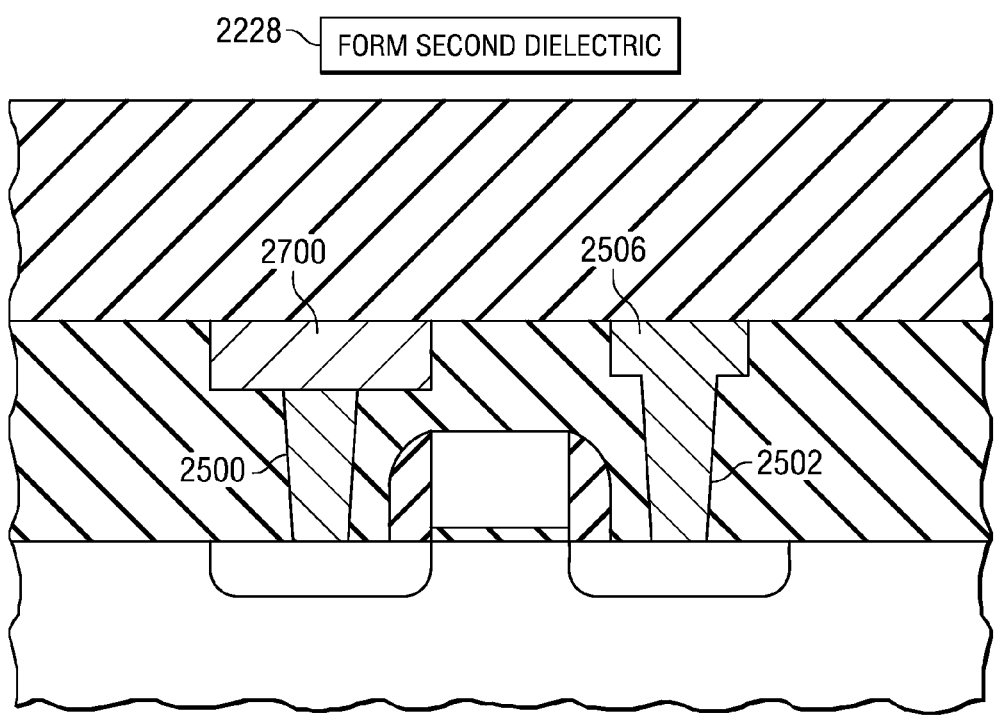
Figure 29:
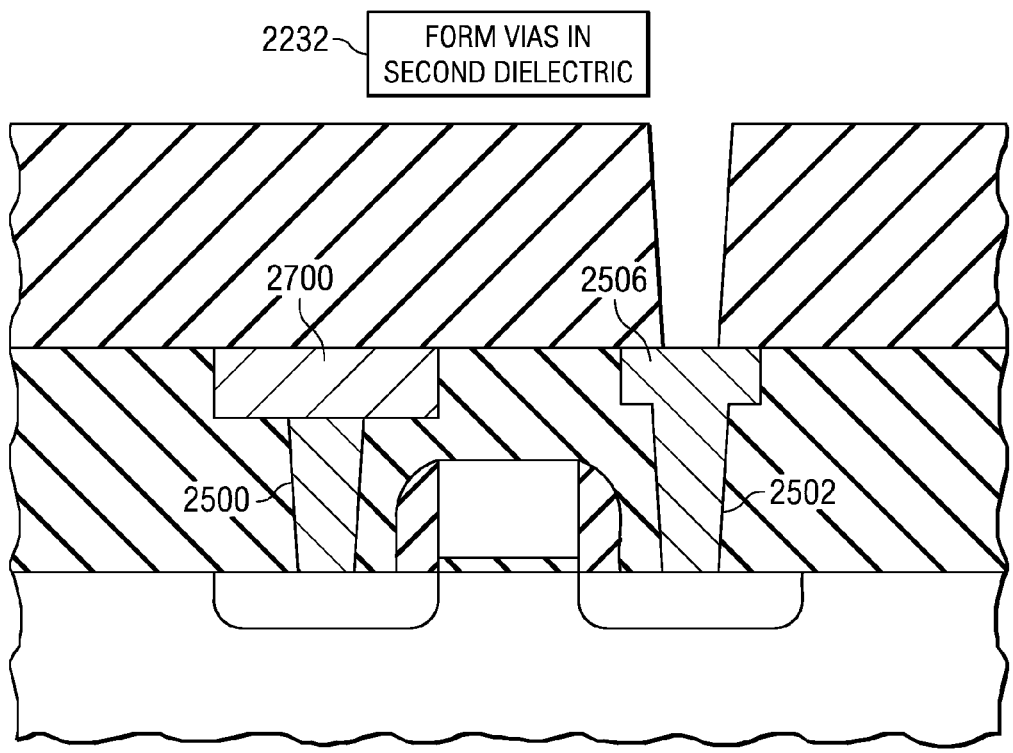
Figure 30:
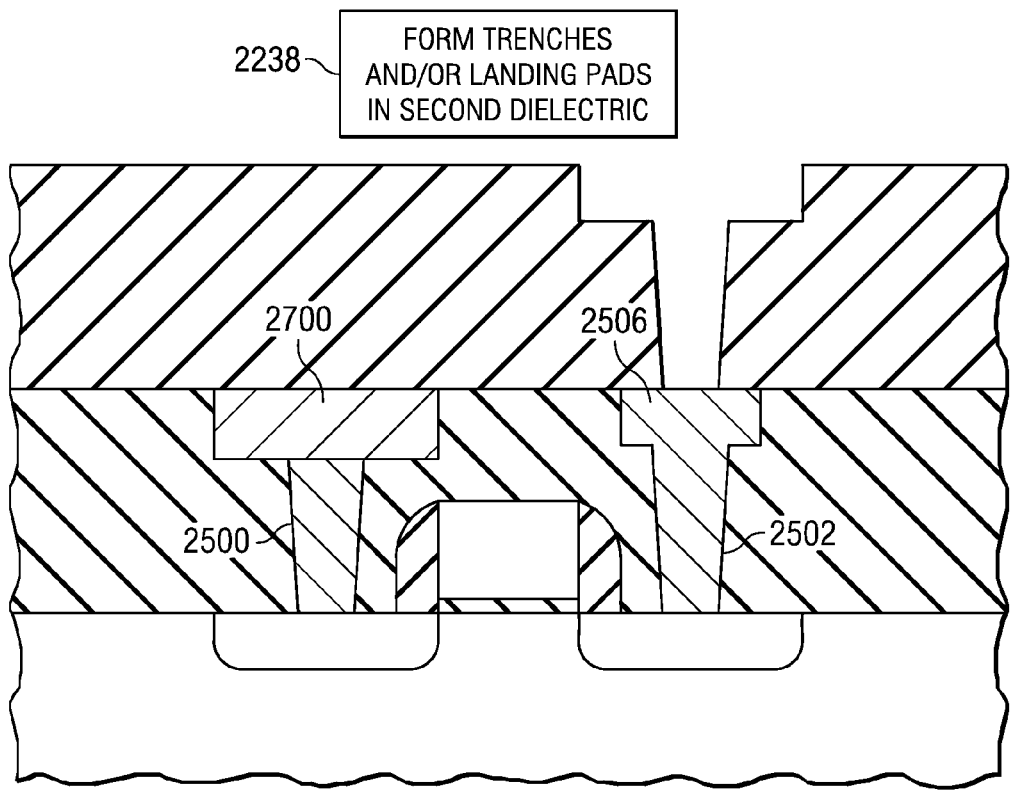
Figure 31:
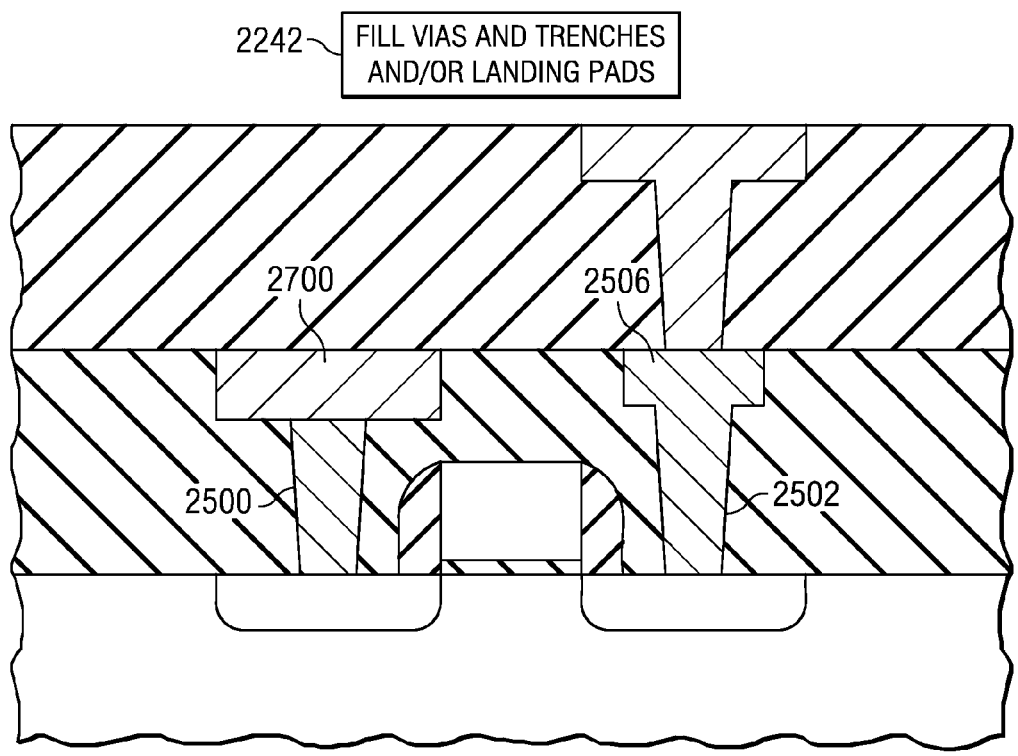

In FIG. 27, the metal1 trenches are filled to make metal1 interconnect lines 2700. As with previous embodiments, the metal1 interconnect lines 2700 can have a different composition from the metal1 landing pads 2506 to achieve a balance between good performance and minimal area.

Figure 32:
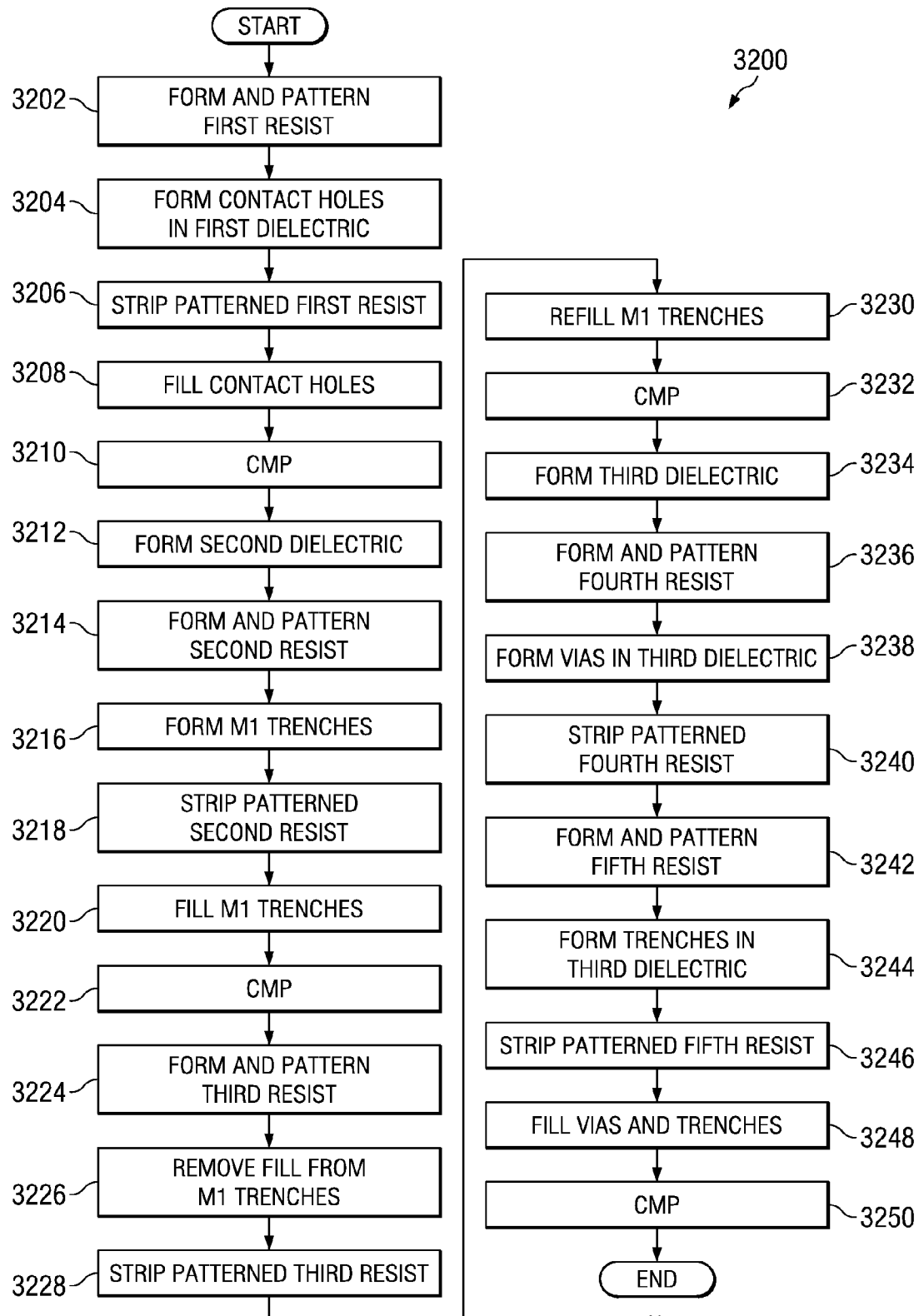
FIG. 32 is another flowchart that illustrates another embodiment of a method for forming a semiconductor device interconnect.

FIG. 32 and associated FIGS. 33-41 show another method 3200 in accordance with aspects of the invention. Compared to previously discussed methods, this method 3200 may be advantageous in that it may provide lower aspect ratios for the contact holes. More specifically, because this method uses a first and second layer of dielectric to form the landing pads and metal1 interconnect lines, the first dielectric layer can be thinner that those discussed in previous methods. Therefore, due to the lower aspect ratios, this method 3200 may provide more reliable yields because etches and fills will be more reliable. As a tradeoff, however, this method 700 will require more masks and lithography steps than the methods previously discussed. Therefore, this method would likely be more expensive to implement.

Figure 38:
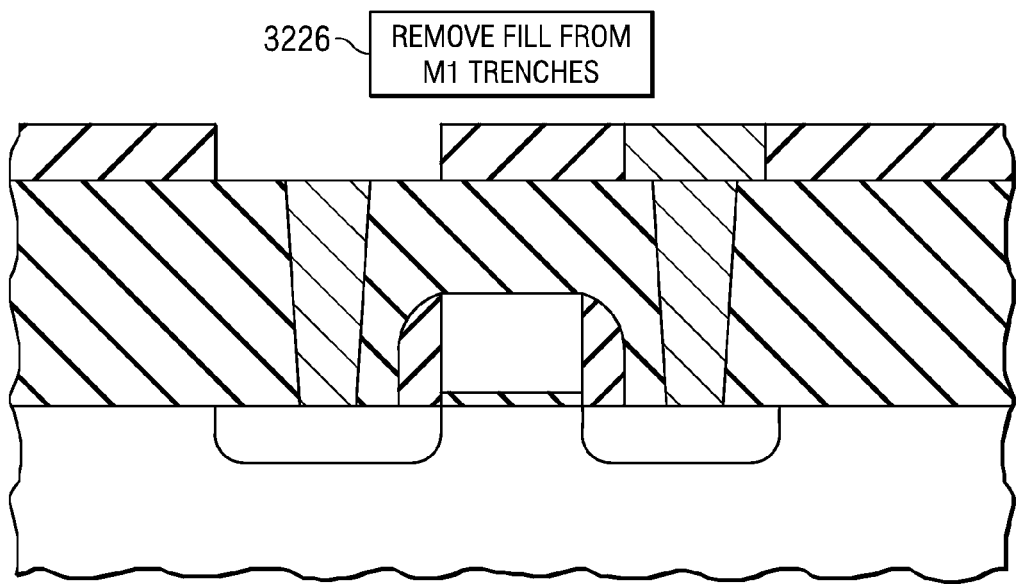
Figure 39:
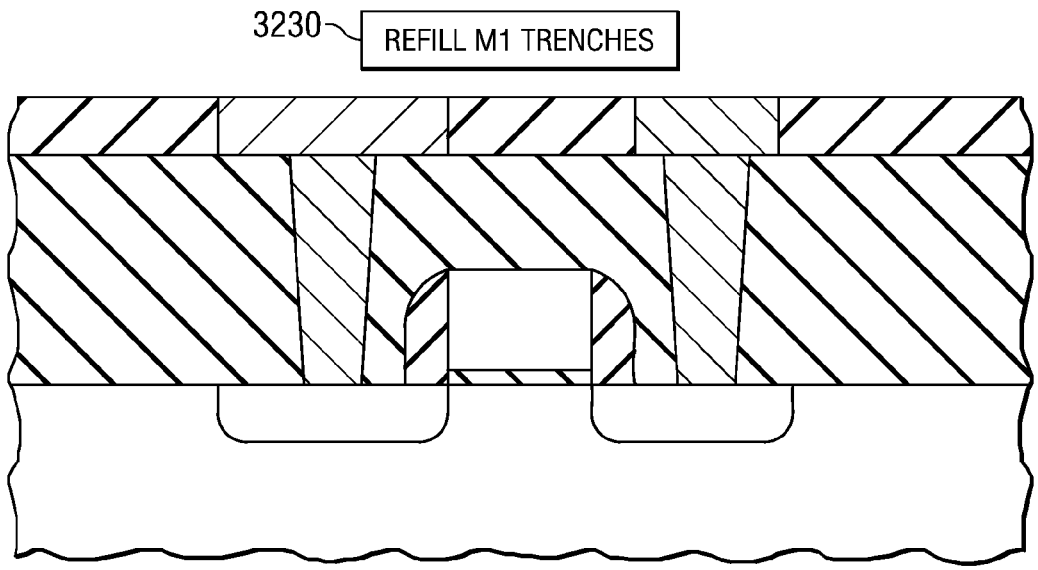
Figure 40:
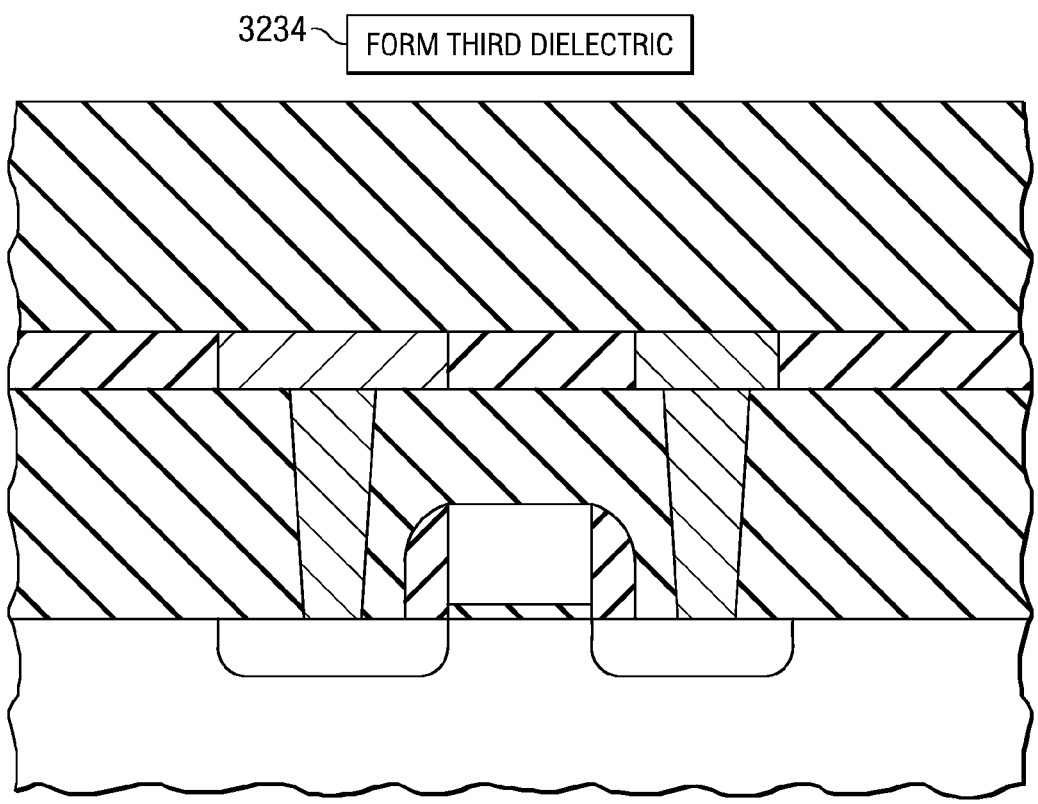
Figure 41:
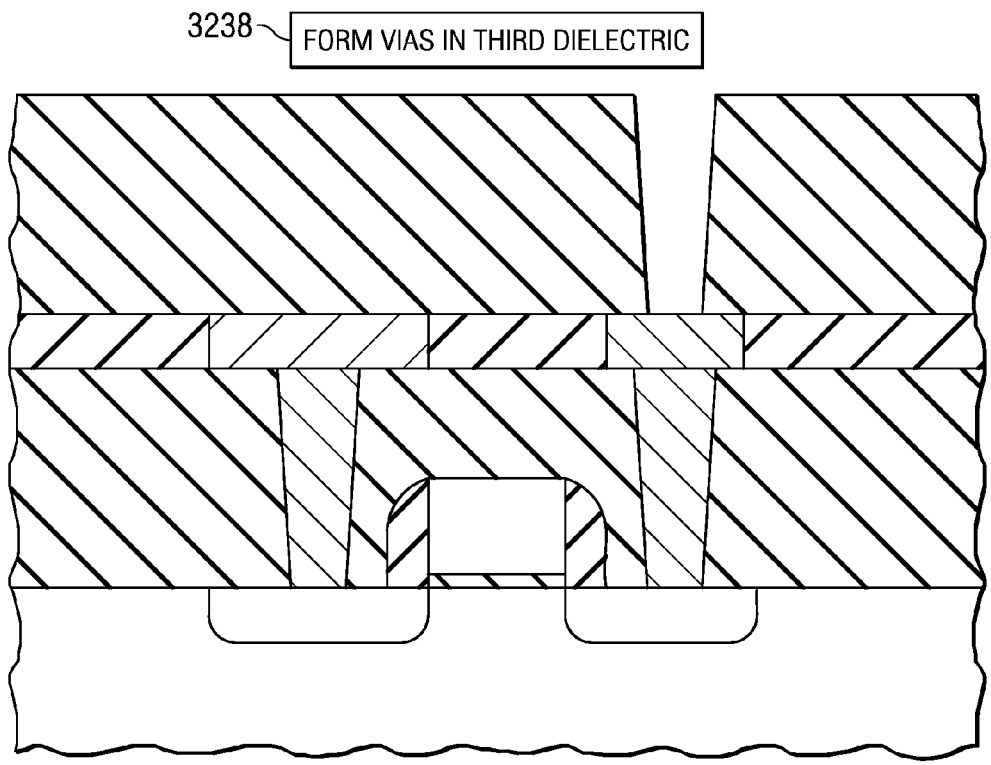
Figure 42:
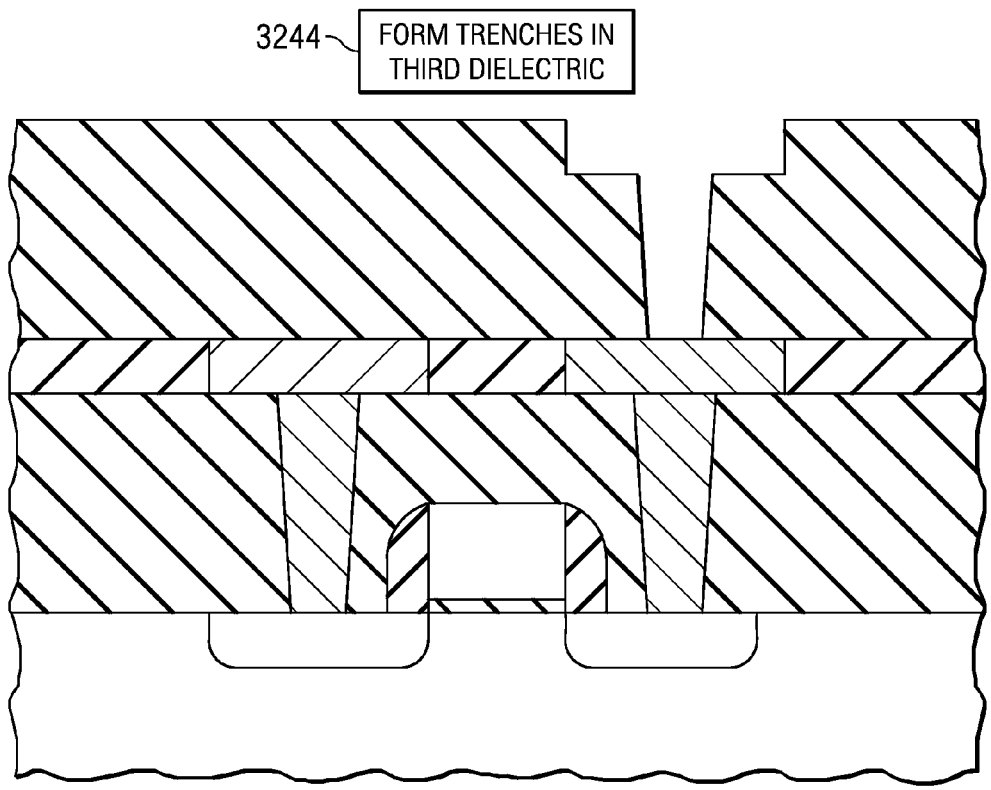
Figure 43:
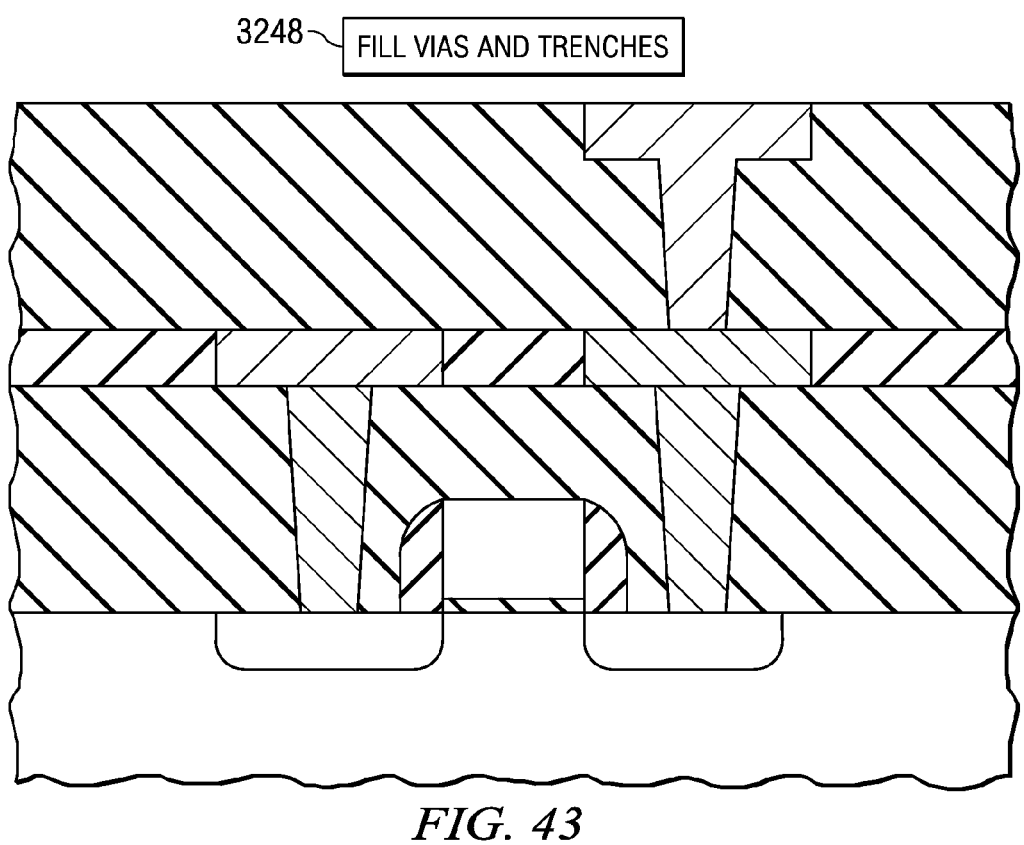

In some embodiments, the blocks corresponding to FIGS. 38 and 39 could be skipped to limit the costs associated with this method. In these non-illustrated embodiments, the contacts, metal1 landing pads, and metal 1 interconnect lines would all be continuously formed out of the same material (e.g., W).

Figure 33:
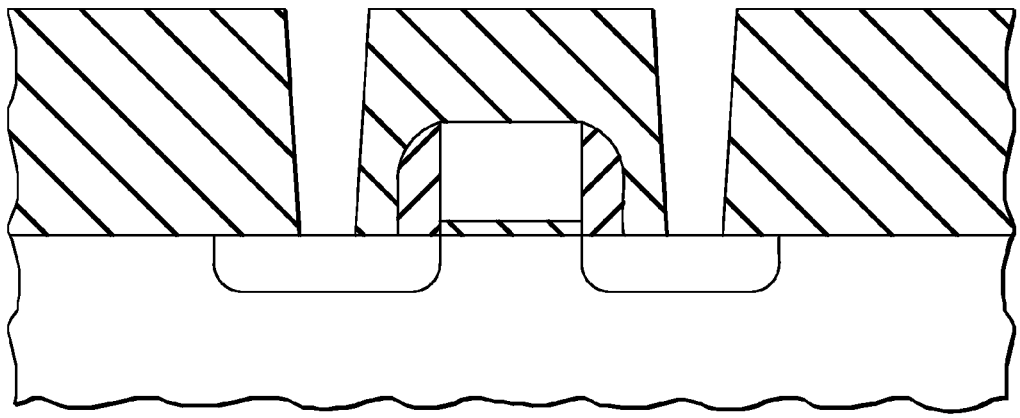
FIGS. 33-43 are cross-sectional views of a more detailed implementation of the embodiment of FIG. 32.

As shown in FIG. 33, contact holes are etched into a first layer of dielectric as previously discussed.

Figure 34:
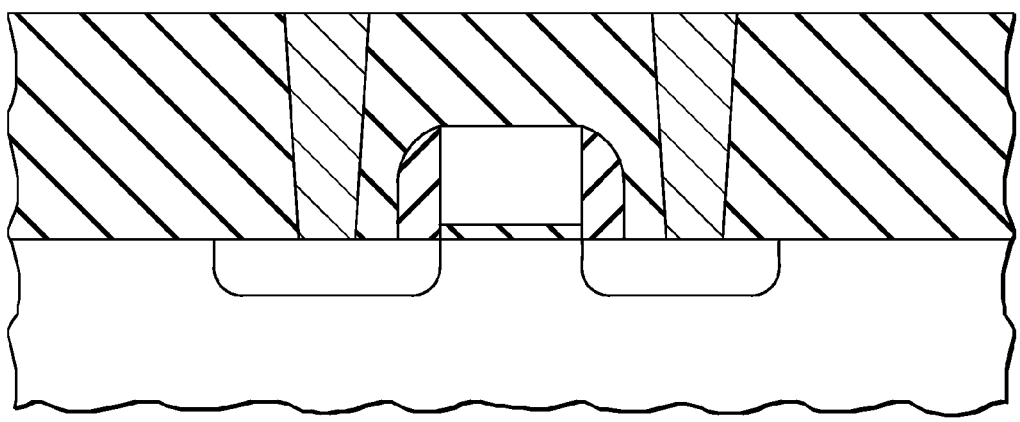

In FIG. 34, fill material is formed within the contact holes to form contacts. Typically, this could be a multi-step fill that includes a liner layer and formation of fill material.

Figure 35:
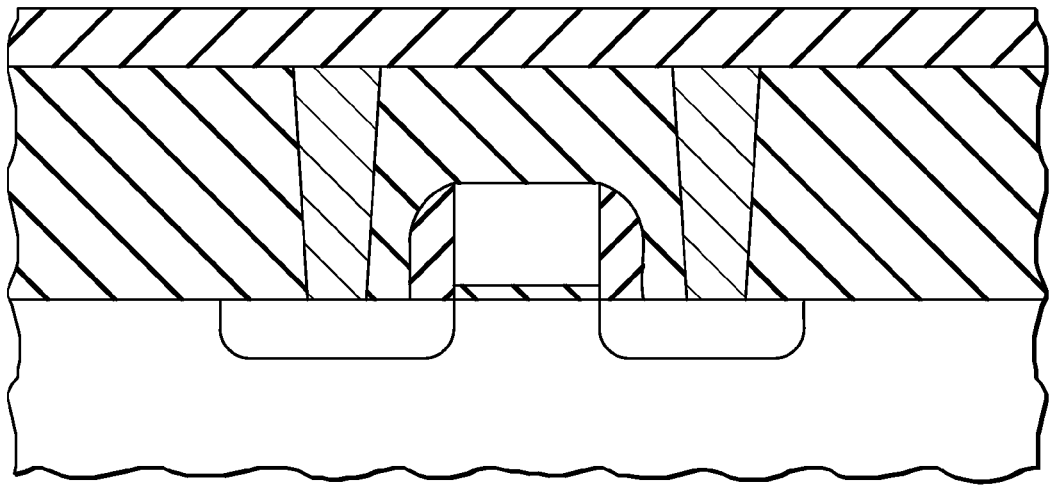

In FIG. 35, a second layer of dielectric material is formed.

Figure 36:
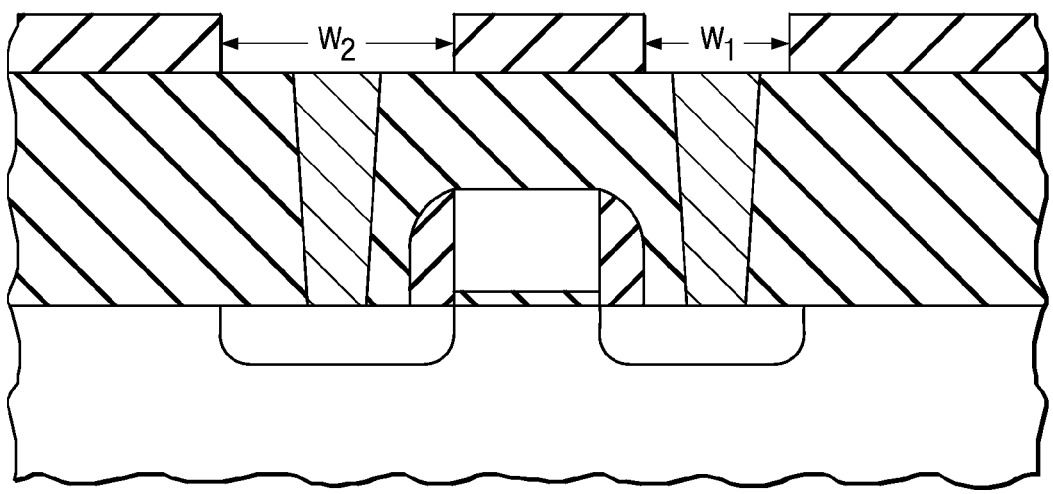

In FIG. 36, metal1 trenches and metal1 landing pad recesses are formed by a suitable etch process.

Figure 37:
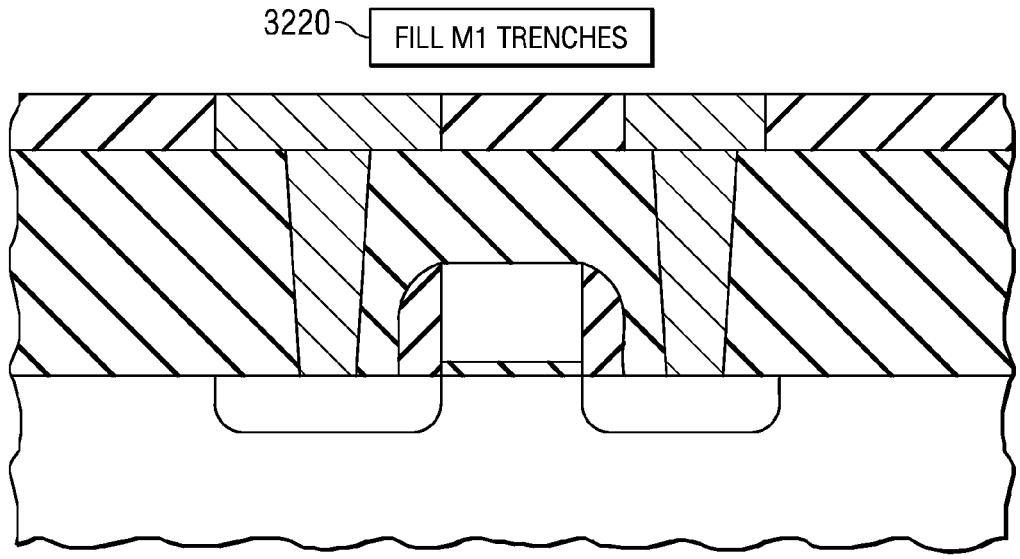

In FIG. 37, the metal1 trenches and metal1 landing pad recesses are filled to form metal1 interconnect lines and metal1 landing pads. For example, tungsten could be deposited to fill these features.

In FIG. 38, the fill from the metal1 interconnect lines has been removed to form metal1 trenches. These trenches will often be the same depth if they were etched at the same time in FIG. 36. Typically when the tungsten is etched out, the trench depth does not change.

In FIG. 39, fill material, such as copper, is deposited or grown to reform the metal1 interconnect lines.

In some embodiments (not illustrated), the metal 1 trenches and metal 1 landing pads could be formed by using separate etch and fill steps. For example, instead of the process flow shown in FIGS. 35-39 where the metal 1 trenches and landing pads are etched concurrently, the metal 1 trenches could be etched in one step and then filled. Subsequently, the landing pads could be etched, and then later filled.

In FIGS. 40-43, a third dielectric layer is formed and vias are formed therein as previously discussed.

Although aspects of the present invention have been illustrated and discussed above with respect to a MOSFET semiconductor device, these aspects are equally applicable to other semiconductor devices: including but not limited to: BJTs, diodes, FinFETS, or any other semiconductor device. These other semiconductor devices will typically have suitable terminals. For example, the terminals of a BJT could include a base, a collector, and an emitter, while the terminals of a diode could include an anode and cathode. Other devices could include other suitable terminals.

It will be appreciated that the substrate and/or semiconductor body as used herein may comprise any type of semiconductor body (e.g., silicon, SiGe, SOD such as a semiconductor wafer and/or one or more dies on a wafer, as well as any other type of semiconductor and/or epitaxial layers associated therewith. Also, while reference is made throughout this document to exemplary structures in discussing aspects of methodologies described herein, those methodologies are not to be limited by the corresponding structures presented. Rather, the methodologies (and structures) are to be considered independent of one another and able to stand alone and be practiced without regard to any of the particular aspects depicted in the figures. Additionally, layers described herein can be formed in any suitable manner, such as with spin-on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated.

What is claimed is:

1. A method of forming an integrated circuit, comprising:
forming first and second contact holes through a first dielectric layer respectively down to first and second terminals of a semiconductor device formed in a semiconductor body;
forming a landing pad recess in the first dielectric layer near a top of the second contact hole;
filling the first contact hole, second contact hole, and landing pad recess with a first fill material comprising tungsten, deposited using a chemical vapor deposition process;
forming an interconnect line trench in the first dielectric layer near a top of the first contact hole; and
filling the interconnect line trench with a second fill material different from the first fill material and comprising copper, using an electroplating process;
whereby first and second contacts comprising tungsten are formed, with the first contact having an interconnect line comprising copper at a top thereof and the second contact having a landing pad comprising tungsten at a top thereof,
wherein the landing pad recess has a length that is less than a minimum length of a copper interconnect line trench as a consequence of the chemical vapor deposition process.

2. The method of claim 1, wherein the first and second terminals are first and second different ones of a source, a drain or a gate of a MOSFET semiconductor device.

3. The method of claim 1, wherein a liner layer of titanium and titanium nitride is first deposited prior to filling the first contact hole, second contact hole, and landing pad recess with the first fill material comprising tungsten.

4. The method of claim 1, wherein a seed layer comprising copper is first deposited using a gaseous deposition process prior to filling the interconnect line trench with the second fill material comprising copper using the electroplating process.

5. The method of claim 1, further comprising forming a second dielectric layer over the first dielectric layer after filling the interconnect line trench with the second fill material; forming a via hole in the second dielectric layer so as to vertically coincide with the landing pad; and filling the via hole with a third fill material to establish electrical contact through the via hole to the landing pad.

6. The method of claim 5, wherein the third fill material comprises copper.

7. The method of claim 5, further comprising forming a second interconnect line trench or second landing pad recess in the second dielectric layer near a top of the via hole; and filling the second interconnect line trench or second landing pad recess with the third fill material.

8. The method of claim 7, wherein the third fill material comprises copper.

9. The method of claim 8, wherein the first and second terminals are first and second different ones of a source, a drain or a gate of a MOSFET semiconductor device.

10. The method of claim 1, wherein filling the first contact hole, second contact hole and landing pad recess is done after forming the interconnect line trench and includes also filling the interconnect line trench with the first fill material using the gaseous deposition process; and further comprising removing the first fill material from the interconnect line trench prior to filling the interconnect line trench with the second fill material.

11. A method of forming an integrated circuit, comprising:
forming first and second contact holes through a first dielectric layer respectively down to first and second terminals of a semiconductor device formed in a semiconductor body;
forming a landing pad recess in the first dielectric layer near a top of the second contact hole;
filling the first contact hole, second contact hole, and landing pad recess with a first fill material comprising tungsten, deposited using a chemical vapor deposition process;
forming an interconnect line trench in the first dielectric layer near a top of the first contact hole and having a greater length than the landing pad recess; and
filling the interconnect line trench with a second fill material having a lower resistance than the first fill material, using an electroplating process;
whereby first and second contacts comprising the first fill material are formed, wherein:
a.) the first contact has a greater length interconnect line comprising the electroplated lower resistance second fill material at a top thereof as a result of the chemical vapor deposition process comprising tungsten; and b) the second contact having a narrower length landing pad than a minimum length of the interconnect line as consequence of the of the chemical vapor deposition process, comprising the chemical vapor deposited higher resistance first fill material at a top thereof.

12. The method of claim 11, wherein filling the first contact hole, second contact hole and landing pad recess is done after forming the interconnect line trench and includes also filling the interconnect line trench with the chemical vapor deposited first fill material; and further comprising removing the first fill material from the interconnect line trench prior to filling the interconnect line trench with the electroplated second fill material.

13. The method of claim 12, further comprising forming a second dielectric layer over the first dielectric layer after filling the interconnect line trench with the second fill material; forming a via hole in the second dielectric layer so as to vertically coincide with the landing pad; and filling the via hole with a third fill material to establish electrical contact through the via hole to the landing pad.

14. The method of claim 13, wherein the second and third fill materials comprise copper.

15. The method of claim 14, wherein the first fill material comprises tungsten.

* * * * *